US009219111B2

(12) United States Patent
Kobayashi et al.

(10) Patent No.: US 9,219,111 B2
(45) Date of Patent: Dec. 22, 2015

(54) NITRIDE SEMICONDUCTOR STRUCTURE AND METHOD OF PREPARING THE SAME

(75) Inventors: Yasuyuki Kobayashi, Atsugi (JP);
Kazuhide Kumakura, Atsugi (JP);
Tetsuya Akasaka, Atsugi (JP); Toshiki Makimoto, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 14/235,765

(22) PCT Filed: Sep. 5, 2012

(86) PCT No.: PCT/JP2012/005633
§ 371 (c)(1),
(2), (4) Date: Jan. 28, 2014

(87) PCT Pub. No.: WO2013/035325
PCT Pub. Date: Mar. 14, 2013

(65) Prior Publication Data
US 2014/0145147 A1    May 29, 2014

(30) Foreign Application Priority Data

Sep. 5, 2011  (JP) ................. 2011-193348
Sep. 5, 2011  (JP) ................. 2011-193350
Mar. 30, 2012 (JP) ................. 2012-080117

(51) Int. Cl.
*H01L 29/04*      (2006.01)
*H01L 21/02*      (2006.01)
(Continued)

(52) U.S. Cl.
CPC ............. *H01L 29/04* (2013.01); *C30B 25/18* (2013.01); *C30B 29/403* (2013.01);
(Continued)

(58) Field of Classification Search
USPC .............................................. 257/22; 438/479
See application file for complete search history.

(56) References Cited

U.S. PATENT DOCUMENTS 5,390,210 A * 2/1995 Fouquet et al. ................. 372/92
6,086,673 A   7/2000 Molnar
(Continued)

FOREIGN PATENT DOCUMENTS

CN       1489248 A       4/2004
CN       1825539 A       8/2006
(Continued)

OTHER PUBLICATIONS

R. Dahal et al., Epitaxially grown semiconducting hexagonal boron nitride as a deep ultraviolet photonic material, May 2011, American Institute of PHysics, Applied Physics Letters 98, 211110-1,2,3.*
(Continued)

*Primary Examiner* — Zandra Smith
*Assistant Examiner* — Lawrence Tynes, Jr.
(74) *Attorney, Agent, or Firm* — Workman Nydegger

(57) ABSTRACT

A nitride semiconductor structure of the present invention is obtained by growing an h- or t-BN thin film (12) and a wurtzite-structure $Al_xGa_{1-x}N$ (x>0) thin film (14) as buffer layers and forming a single-crystal wurtzite-structure AlGaInBN thin film (13) thereon. While GaN, AlGaN, AlN, and the like have the wurtzite structure with $sp^3$ bonds, h-BN or t-BN has the graphite structure with $sp^2$ bonds, and has a completely different crystal structure. Accordingly, it has heretofore not been considered that a wurtzite-structure AlGaInBN thin film can be grown on a graphite-structure h-BN thin film. However, when a wurtzite-structure $Al_xGa_{1-x}N$ (x>0) thin film (14) is formed as a buffer layer on a graphite-structure boron nitride thin film (12), a wurtzite-structure AlGaInBN (13) nitride semiconductor structure such as GaN can be grown on the buffer layer.

20 Claims, 42 Drawing Sheets

(51) Int. Cl.
H01L 29/15 (2006.01)
H01L 29/16 (2006.01)
H01L 33/32 (2010.01)
C30B 25/18 (2006.01)
C30B 29/40 (2006.01)
H01L 29/778 (2006.01)
H01L 29/20 (2006.01)
H01L 33/12 (2010.01)
H01L 33/16 (2010.01)

(52) U.S. Cl.
CPC ....... H01L 21/0242 (2013.01); H01L 21/0254 (2013.01); H01L 21/0259 (2013.01); H01L 21/0262 (2013.01); H01L 21/02378 (2013.01); H01L 21/02381 (2013.01); H01L 21/02458 (2013.01); H01L 21/02505 (2013.01); H01L 21/02529 (2013.01); H01L 21/02609 (2013.01); H01L 21/02661 (2013.01); H01L 29/15 (2013.01); H01L 29/1608 (2013.01); H01L 29/7786 (2013.01); H01L 33/32 (2013.01); H01L 29/2003 (2013.01); H01L 33/12 (2013.01); H01L 33/16 (2013.01)

(56) References Cited

U.S. PATENT DOCUMENTS

| 6,316,785 | B1 | 11/2001 | Nunoue et al. | |
|---|---|---|---|---|
| 2005/0232327 | A1* | 10/2005 | Nomura et al. | 372/50.12 |
| 2008/0075927 | A1 | 3/2008 | Sakashita | |
| 2011/0127581 | A1 | 6/2011 | Bethoux et al. | |

FOREIGN PATENT DOCUMENTS

| FR | 2953328 | 6/2011 |
|---|---|---|
| JP | 03-19-1993 | 3/1993 |
| JP | 2005-117053 | 4/2005 |
| JP | 2005117053 | 4/2005 |
| JP | 2006-344618 | 12/2006 |
| JP | 2007-186350 | 7/2007 |
| JP | 2010-45319 | 2/2010 |
| JP | 2010123818 | 6/2010 |
| KR | 2001-0069992 | 7/2001 |
| KR | 100713031 | 4/2007 |
| WO | 2011/022724 A1 | 2/2011 |
| WO | 2011/067276 | 6/2011 |

OTHER PUBLICATIONS

Extended European Search Report in corresponding EP Application No. 12829358.6 dated Jun. 15, 2015.
Xu et al. "Structure transition of BN layers and its influences on the mechanical properties of AlN/BN nanomultilayers" Thin Solid Films, vol. 516, No. 23, Oct. 1, 2008, pp. 8640-8645, XP025519025.
Amano et al., "Metalorganic vapor phase epitaxial growth of a high quality GaN film using an AlN buffer layers," Applied Physics Letters, vol. 48, pp. 353-355, Feb. 1986.
Shuji Nakamura, "GaN Growth Using GaN Buffer Layer," Japanese Journal of Applied Physics, vol. 30, pp. L1705-L1707, Oct. 1991.
Kumakura et al., "Growth of GaN on sapphire substrates using novel buffer layers of ECR-plasma-sputtered $Al_2O_3$/graded-AlON/AlN/$Al_2O_3$," Journal of Crystal Growth, vol. 292, pp. 155-158, Jun. 2006.
Wong et al., "Damage-free separation of GaN thin films from sapphire substrates," Applied Physics Letters, vol. 72, pp. 599-601, Feb. 1998.
Lee et al., "Lattice strain in bulk GaN epilayers grown on CrN/sapphire template," Applied Physics Letters, vol. 94,.082105, 3 pages, 2009.
Rogers et al. "Use of ZnO thin films as sacrificial templates for metal organic vapor phase epitaxy and chemical lift-off of GaN," Applied Physics Letters, vol. 91, 071120, 3 pages, 2007.
S. Tripathy et al., "InGaN/GaN light emitting diodes on nanoscale silicon on insulator," Applied Physics Letters, vol. 91, 231109, 3 pages, 2007.
International Search Report for corresponding Application No. PCT/JP2012/005633, dated Oct. 16, 2012.
Boo J-H et al: "MOCVD of BN and GaN thin films on silicon: new attempts of GaN growth with BN buffer layer, "Journal of Crystal Growth, vol. 189-190, Jun. 15, 1998, pp. 439-444.
Kobayashi Y et al: "Hexagonal BN epitaxial growth on (0001) sapphire substrate by MOVPE," Journal of Crystal Growth, vol. 310, No. 23, Nov. 15, 2008, pp. 5044-5047.
Boo J-H et al: "Growth of Boron Nitride Thin Films of Silicon Substrates Using New Organoboron Precursors," vol. 176, No. 1, Jan. 1, 1999, pp. 705-710.
Partial Search Report dated Mar. 12, 2015 in corresponding European Patent Application No. 12829358.6.
International Preliminary Report on Patentability and Written Opinion in corresponding Application No. PCT/JP2012/005633, dated Mar. 12, 2014.
Chinese Office Action dated Aug. 17, 2015 in corresponding Chinese Application No. 2012800378245.

* cited by examiner

[1$\bar{1}$00] DIRECTION OF SAPPHIRE SUBSTRATE

[11$\bar{2}$0] DIRECTION OF SAPPHIRE SUBSTRATE

I-V CHARACTERISTIC

NITRIDE SEMICONDUCTOR STRUCTURE AND METHOD OF PREPARING THE SAME

TECHNICAL FIELD

The present invention relates to a nitride semiconductor structure and a method of preparing the same.

BACKGROUND ART

Wurtzite-structure AlGaInBN has very large direct band gaps of 0.7 eV to 6.2 eV, and can form quantum well structures and two-dimensional electron gases by forming heterojunctions. Further, the breakdown field of GaN is $3.3 \times 10^6$ V/cm, which is approximately eight times larger than that of GaAs, and GaN has a high saturation electron velocity. With these excellent characteristics, wurtzite-structure AlGaInBN has been applied and commercialized in the following three fields:

(1) The first ones are light-emitting diodes (LEDs) in the blue-to-green range of the visible region constructed using wurtzite-structure AlGaInBN. The LEDs have features such as low power consumption, long life, and small size, and have been widely commercialized in traffic signals, electronic signage, backlights for displays, LED displays, various kinds of lighting, exposure light sources, and the like. Moreover, semiconductor lasers (LDs) constructed using wurtzite-structure AlGaInBN have smaller sizes, lower power consumption, and lower manufacturing costs than other lasers, and therefore have been widely commercialized in video game consoles and light sources for next-generation optical discs.

(2) The second ones are high-frequency, high-output devices constructed using wurtzite-structure AlGaInBN. For example, AlGaN/GaN high-electron-mobility transistors (HEMTs) have two-dimensional electron gases with high carrier concentrations and high saturation electron velocities and high breakdown fields, and are therefore being commercialized as devices for mobile phone base stations by being used as millimeter-band, high-frequency, high-output transistors.

(3) The third ones are high-efficiency solar cells constructed using wurtzite-structure AlGaInBN. Nitride semiconductors are wide band-gap semiconductors, and can absorb sunlight in almost the whole range. Moreover, by forming heterostructures, very high-efficiency solar cells may be realized.

Heretofore, wurtzite-structure AlGaInBN has been grown on a sapphire substrate. Sapphire substrates are relatively inexpensive, may be large-area substrates, and are excellent in crystallinity and electrically insulative, thus being widely used in application to the above-described devices. However, since there are a large lattice mismatch and a thermal expansion coefficient difference between wurtzite-structure AlGaInBN and a sapphire substrate, it has been difficult to grow a single-crystal wurtzite-structure nitride semiconductor such as GaN, AlN, or AlGaN.

To solve this problem, it has already been proposed that a buffer layer is grown on a sapphire substrate, followed by the growth of wurtzite-structure AlGaInBN on the buffer layer. For the buffer layer, the following growing methods have been proposed: a method (referred to as "LT-AlN") in which an AlN layer is grown at a low temperature, a method (referred to as "LT-GaN") in which a GaN layer is grown at a low temperature, and a method (referred to as "AlON") in which an $Al_2O_3$/AlON/AlN/$Al_2O_3$ multilayered film is grown by ECR plasma sputtering.

In LT-AlN, a thin amorphous AlN layer is formed as a buffer layer at a low temperature of approximately 500° C. using a metalorganic chemical vapor deposition (MOCVD) system, the buffer layer is annealed at a high temperature of approximately 1000° C., and a nitride semiconductor such as GaN is grown on the annealed AlN layer (see Non-Patent Literature 1). It has been reported that LT-AlN allows single-crystal, crack-free, high-quality GaN to grow on a sapphire substrate.

In LT-GaN, a thin amorphous GaN layer is formed as a buffer layer at a low temperature of approximately 500° C. using an MOCVD system as in LT-AlN, the buffer layer is annealed at a high temperature of approximately 1000° C., and a nitride semiconductor such as GaN is grown on the annealed GaN layer (see Non-Patent Literature 2). It has been reported that LT-GaN allows single-crystal, high-mobility, high-quality GaN to grow on a sapphire substrate by LT-GaN.

In AlON, a multilayered film including an $Al_2O_3$ layer, a graded-composition AlON layer, an AlN layer, and an $Al_2O_3$ layer is grown as a buffer layer on a sapphire substrate by ECR plasma sputtering, and GaN is grown on the buffer layer by MOCVD (see Non-Patent Literature 3). It has been reported that planar, high-quality GaN can be grown by this technique.

Moreover, for realizing a ubiquitous society in which light-emitting devices such as LEDs and LDs constructed using wurtzite-structure AlGaInBN can be used anytime and anywhere, it is necessary to grow wurtzite-structure AlGaInBN on a larger-area or more inexpensive, bendable (flexible) substrate. However, growth on such a substrate is difficult. Moreover, in the case where a high-frequency, high-output device such as described above is grown on a sapphire substrate or a silicon carbide substrate, such a substrate has a heat dissipation problem because of the low thermal conductivity thereof. This heat dissipation problem considerably limits device characteristics. Growth on a substrate, e.g., a copper substrate, having a high thermal conductivity is desired. However, growth on such a substrate is difficult. Further, solar cells are expected to be used outdoors and at large-area and bendable places, and are therefore desired to be grown on a large-area or inexpensive, bendable substrate, a transparent plastic or glass substrate, or the like. However, conventional techniques cannot grow solar cells on such a substrate.

To solve such problems, it has been proposed that a wurtzite-structure AlGaInBN thin film grown on a sapphire substrate or a silicon carbide substrate is separated from the sapphire substrate or the silicon carbide substrate to be transferred to a second substrate suitable for the application, and this is being researched.

A wurtzite-structure AlGaInBN thin film can be grown on a sapphire substrate or a silicon carbide substrate by vapor phase epitaxy (VPE) or MOCVD. To separate the wurtzite-structure AlGaInBN thin film grown by VPE or MOCVD from the sapphire substrate or the silicon carbide substrate and transfer the wurtzite-structure AlGaInBN thin film to a second substrate, there are two methods proposed. One is to irradiate a wurtzite-structure AlGaInBN thin film grown on a low temperature-grown GaN buffer layer on a sapphire substrate with, for example, an excimer laser having a wavelength of 248 nm to melt GaN at the interface with the sapphire substrate, thus separating the wurtzite-structure AlGaInBN thin film from the sapphire substrate. The separated wurtzite-structure AlGaInBN thin film is transferred to a second substrate. This method is called "laser lift-off" (see Non-Patent Literature 4). The other is to grow a chemically etchable chromium nitride (CrN) or zinc oxide (ZnO) buffer layer on a sapphire substrate, grow a wurtzite-structure AlGaInBN thin film on the buffer layer, and etch the buffer layer existing at the interface by chemical etching after the growth, thus separating the wurtzite-structure AlGaInBN thin film from the sapphire substrate. The separated wurtzite-structure AlGaInBN thin film is transferred to a second substrate. This method is called "chemical lift-off" (see Non-Patent Literature 5 and 6).

In this method, CrN is grown on the sapphire substrate by sputtering, and a nitride semiconductor such as GaN is grown on the CrN by MOCVD (Non-Patent Literature 5). By immersing the sample in a perchloric acid-based etchant for CrN, the CrN sacrificial layer is chemically etched, and the nitride semiconductor thin film made of GaN or the like is separated from the sapphire substrate.

Alternatively, ZnO is grown on the sapphire substrate by pulsed laser deposition, and a nitride semiconductor such as GaN is grown on the ZnO by MOCVD (Non-Patent Literature 6). By immersing the sample in diluted hydrogen chloride, the ZnO sacrificial layer is chemically etched, and the nitride semiconductor thin film made of GaN or the like is separated from the sapphire substrate.

Further, wurtzite AlGaInBN is also grown on a silicon (Si) substrate. Si substrates are inexpensive, may be large-area substrates, and are excellent in crystallinity, thus being used in the above-described application to LED devices. However, an LED on a Si substrate has the following problem: light emitted from a multiple-quantum-well structure as a light-emitting layer is absorbed by the Si substrate, and, as a result, the light extraction efficiency of the LED on the Si substrate significantly decreases. Further, in the LED on the Si substrate, for the reduction of meltback etching and a lattice mismatch between the Si substrate and GaN, a wurtzite AlN layer needs to be grown as a buffer layer on the Si substrate. However, it is generally difficult to obtain an n-type AlN layer by doping the wurtzite AlN layer with Si due to self-compensation effect. Thus, there is the problem that it is difficult to grow vertical LEDs, which will be indispensable for high-output LEDs in the future, on Si substrates.

To solve this problem, it has been proposed that a wurtzite AlGaInBN thin film is grown on a SOI (Si-on-insulator) substrate. $SiO_2$ and a Si sacrificial layer formed thereon are chemically etched and mechanically polished after growth. As a result, the wurtzite AlGaInBN thin film can be separated from the SOI substrate and transferred to a metal substrate with high reflectance.

In this method, SOI is grown in a Si substrate by the SIMOX (Separated by Implanted Oxygen) process, and a nitride semiconductor such as GaN is grown on the SOI by MOCVD (Non-Patent Literature 7). The sample is mechanically polished and immersed in a potassium hydroxide solution, whereby $SiO_2$ and a Si sacrificial layer formed thereon are chemically etched. Thus, the nitride semiconductor thin film made of GaN or the like can be transferred from the Si substrate to a metal substrate with high reflectance.

CITATION LIST

Non-Patent Literature

NPL 1: H. Amano, N. Sawaki, I. Akasaki, and Y. Toyoda, "Metalorganic vapor phase epitaxial growth of a high quality GaN film using an AlN buffer layers," Applied Physics Letters, Vol. 48, pp. 353, 1986.

NPL 2: S. Nakamura, "GaN Growth Using GaN Buffer Layer," Japanese Journal of Applied Physics, Vol. 30, pp. L1705-L1707, 1991.

NPL 3: K. Kumakura and T. Makimoto, "Growth of GaN on sapphire substrates using novel buffer layers of ECR-plasma-sputtered Al2O3/graded-AlON/AlN/Al2O3," Journal of Crystal Growth, Vol. 292, pp. 155-158, 2006.

NPL 4: W. S. Wong, T. Sands, and N. W. Cheung, "Damage-free separation of GaN thin films from sapphire substrates," Applied Physics Letters, Vol. 72, pp. 599, 1998.

NPL 5: S. W. Lee, Jun-Seok Ha, Hyun-Jae Lee, Hyo-Jong Lee, H. Goto, T. Hanada, T. Goto, K. Fujii, M. W. Cho, and T. Yao, "Lattice strain in bulk GaN epilayers grown on CrN/sapphire template," Applied Physics Letters, Vol. 94, pp. 082105-1, 2009.

NPL 6: D. J. Rogers, F. H. Teherani, A. Ougazzaden, S. Gautier, L. Divay, A. Lusson, O. Durand, F. Wyczisk, G. Garry, T. Monteiro, M. R. Correira, M. Peres, A. Neves, D. McGrouther, J. N. Chapman, and M. Razeghi, "Use of ZnO thin films as sacrificial templates for metal organic vapor phase epitaxy and chemical lift-off of GaN," Applied Physics Letters, Vol. 91, 071120-1, 2007.

NPL 7: S. Tripathy, V. K. X. Lin, S. L. Teo, A. Dadger, A. Diez, J. Blasing, and A. Krost, "InGaN/GaN light emitting diodes on nanoscale silicon on insulator," Applied Physics Letters, Vol. 91, pp. 231109-1, 2007.

SUMMARY OF INVENTION

Technical Problem

In LT-AlN, since deposition is performed at a low temperature, the AlN layer is an amorphous crystal, and the optimization of substrate temperature and film thickness for depositing the AlN layer is required. Moreover, since the AlN layer is deposited at a low temperature of approximately 500° C. and then GaN is grown at a high temperature of approximately 1000° C., temperature needs to be greatly increased and reduced. Thus, a growth program becomes complicated.

Moreover, in LT-GaN, since deposition is performed at a low temperature as in LT-AlN, the GaN layer is an amorphous crystal, and the optimization of substrate temperature and film thickness for depositing the GaN layer is required. Moreover, since GaN is deposited at a low temperature of approximately 500° C. and then GaN is grown at a high temperature of approximately 1000° C., temperature needs to be greatly increased and reduced. Thus, a growth program becomes complicated. Further, GaN has a band gap of 3.4 eV. In the case where an LED in the range of not more than 363 nm is grown on GaN grown at a high temperature, light emitted by the LED is absorbed on the substrate side.

Moreover, AlON requires an ECR plasma sputtering system for the formation of the AlON layer as well as an MOCVD system for the growth of GaN.

Moreover, laser lift-off has the following problems: equipment for laser lift-off is expensive; productivity is low because of single-substrate processing; damage is inflicted on the wurtzite-structure AlGaInBN thin film to increase defects and the like; and the like.

Moreover, chemical lift-off requires an RF sputtering system for the growth of the CrN buffer layer, and has the following problems: a process for depositing the CrN buffer layer is complicated; a process for etching CrN using perchloric acid is required; and the like.

Moreover, the deposition of the ZnO sacrificial layer requires a pulsed laser deposition (PLD) system, and also requires optimization for the growth of the ZnO sacrificial layer. Further, an etchant and an etching process for the ZnO sacrificial layer are also required to separate the nitride semiconductor thin film made of GaN or the like.

Further, the deposition of the SOI substrate requires an SIMOX system. Mechanical polishing, a potassium hydroxide solution, and an etching process are also required to etch the $SiO_2$ and the Si sacrificial layer formed thereon.

The present invention has been made in view of the above-described problems. An object of the present invention is to provide a method of preparing a nitride semiconductor structure including a wurtzite-structure AlGaInBN thin film on a sapphire substrate by an easier process than conventional techniques and a nitride semiconductor structure prepared by the same.

Another object of the present invention is to reduce process complexity, high cost, and the like of conventional techniques in a method of separating a wurtzite-structure AlGaInBN thin film grown on a sapphire substrate from the sapphire substrate to prepare a nitride semiconductor structure including the wurtzite-structure AlGaInBN thin film on a second substrate.

Still another object of the present invention is to provide a nitride semiconductor structure including a wurtzite-structure AlGaInBN thin film provided on a substrate other than a sapphire substrate.

Yet another object of the present invention is to provide a method of preparing a nitride semiconductor structure including a wurtzite-structure AlGaInBN thin film which can be separated from any one of a sapphire substrate, a Si substrate, and a silicon carbide (SiC) substrate by an easier process than conventional techniques and a nitride semiconductor structure prepared by the same.

Solution to Problem

To achieve the above-described objects, a first aspect of the present invention is a nitride semiconductor structure including a graphite-structure boron nitride thin film, a wurtzite-structure $Al_xGa_{1-x}N$ (x>0) thin film on the graphite-structure boron nitride thin film, and a wurtzite-structure AlGaInBN thin film on the wurtzite-structure $Al_xGa_{1-x}N$ (x>0) thin film.

A second aspect of the present invention is the first aspect further including a sapphire substrate, wherein the graphite-structure boron nitride thin film and the wurtzite-structure $Al_xGa_{1-x}N$ (x>0) thin film constitute a buffer layer on the sapphire substrate.

A third aspect of the present invention is any one of the first and second aspects, wherein the graphite-structure boron nitride thin film is any one of a (0001) hexagonal boron nitride thin film and a turbostratic boron nitride thin film.

A fourth aspect of the present invention is the third aspect, wherein the graphite-structure boron nitride thin film has a film thickness equal to or more than that of a one-atom-thick layer.

A fifth aspect of the present invention is any one of the first to fourth aspects, further including a multiple-quantum-well structure on the wurtzite-structure AlGaInBN thin film and a second wurtzite-structure AlGaInBN thin film on the multiple-quantum-well structure.

A sixth aspect of the present invention is the first aspect, further including a bonding layer on a substrate other than a sapphire substrate, wherein the wurtzite-structure $Al_xGa_{1-x}N$ (x>0) thin film and the graphite-structure boron nitride thin film constitute a buffer layer.

A seventh aspect of the present invention is the sixth aspect, wherein the bonding layer is conductive.

An eighth aspect of the present invention is the first aspect, further including a sapphire substrate, any one of a wurtzite AlN, a wurtzite GaN thin film, and a wurtzite AlGaN thin film on the sapphire substrate, and a wurtzite-structure $Al_xGa_{1-x}N$ (x>0) thin film on the any one of the wurtzite AlN, the wurtzite GaN thin film, and the wurtzite AlGaN thin film, wherein the any one of the wurtzite AlN, the wurtzite GaN thin film, and the wurtzite AlGaN thin film constitutes a buffer layer on the sapphire substrate, and the wurtzite-structure $Al_xGa_{1-x}N$ (x>0) thin film, the graphite-structure boron nitride thin film, and the wurtzite-structure $Al_xGa_{1-x}N$ (x>0) thin film constitute a double heterostructure on the buffer layer.

A ninth aspect of the present invention is the eighth aspect, wherein the graphite-structure boron nitride thin film is any one of a (0001) hexagonal boron nitride thin film and a turbostratic boron nitride thin film.

A tenth aspect of the present invention is the ninth aspect, wherein the graphite-structure boron nitride thin film has a film thickness equal to or more than that of a one-atom-thick layer.

An eleventh aspect of the present invention is the first aspect, further including a Si substrate, a wurtzite AlN thin film on the Si substrate, and a wurtzite-structure $Al_xGa_{1-x}N$ (x>0) thin film on the wurtzite AlN thin film, wherein the wurtzite AlN thin film constitutes a buffer layer on the Si substrate, and the wurtzite-structure $Al_xGa_{1-x}N$ (x>0) thin film, the graphite-structure boron nitride thin film, and the wurtzite-structure $Al_xGa_{1-x}N$ (x>0) thin film constitute a double heterostructure on the buffer layer.

A twelfth aspect of the present invention is the eleventh aspect, wherein the graphite-structure boron nitride thin film is any one of a (0001) hexagonal boron nitride thin film and a turbostratic boron nitride thin film.

A thirteenth aspect of the present invention is the twelfth aspect, wherein the graphite-structure boron nitride thin film has a film thickness equal to or more than that of a one-atom-thick layer.

A fourteenth aspect of the present invention is the first aspect, further including a SiC substrate, and a wurtzite-structure $Al_xGa_{1-x}N$ (x>0) thin film on the SiC substrate, wherein the wurtzite-structure $Al_xGa_{1-x}N$ (x>0) thin film, the graphite-structure boron nitride thin film, and the wurtzite-structure $Al_xGa_{1-x}N$ (x>0) thin film constitute a double heterostructure on the SiC substrate.

A fifteenth aspect of the present invention is the fourteenth aspect, wherein the graphite-structure boron nitride thin film is any one of a (0001) hexagonal boron nitride thin film and a turbostratic boron nitride thin film.

A sixteenth aspect of the present invention is the fifteenth aspect, wherein the graphite-structure boron nitride thin film has a film thickness equal to or more than that of a one-atom-thick layer.

A seventeenth aspect of the present invention is a preparation method including the steps of growing a buffer layer on a sapphire substrate, and growing a wurtzite-structure AlGaInBN thin film on the buffer layer to prepare a nitride semiconductor structure, wherein the buffer layer includes a graphite-structure boron nitride thin film on the sapphire substrate and a wurtzite-structure $Al_xGa_{1-x}N$ (x>0) thin film on the boron nitride thin film.

An eighteenth aspect of the present invention is the seventeenth aspect, wherein the graphite-structure boron nitride thin film is any one of a hexagonal boron nitride thin film and a turbostratic boron nitride thin film.

A nineteenth aspect of the present invention is a method of preparing a nitride semiconductor structure including a wurtzite-structure AlGaInBN thin film, including the steps of growing a buffer layer on a sapphire substrate, growing a wurtzite-structure AlGaInBN thin film on the buffer layer, and mechanically separating the buffer layer and the wurtzite-structure AlGaInBN thin film from the buffer layer to prepare the nitride semiconductor structure including the wurtzite-structure AlGaInBN thin film, wherein the buffer layer includes a graphite-structure boron nitride thin film on the sapphire substrate and a wurtzite-structure $Al_xGa_{1-x}N$ (x>0) thin film on the graphite-structure boron nitride thin film.

A twentieth aspect of the present invention is the nineteenth aspect, wherein the graphite-structure boron nitride thin film is any one of a hexagonal boron nitride thin film and a turbostratic boron nitride thin film.

A twenty-first aspect of the present invention is the twentieth aspect, wherein the graphite-structure boron nitride thin film has a film thickness equal to or more than that of a one-atom-thick layer.

A twenty-second aspect of the present invention is any one of the nineteenth to twenty-first aspects, further including, before the separation, the step of bonding the wurtzite-structure AlGaInBN thin film to a bonding layer on a second substrate.

A twenty-third aspect of the present invention is any one of the nineteenth to twenty-first aspects, further including, before the separation, the steps of further growing a second wurtzite-structure AlGaInBN thin film on the wurtzite-structure AlGaInBN thin film, and bonding the second wurtzite-structure AlGaInBN thin film to a bonding layer on a second substrate.

A twenty-fourth aspect of the present invention is any one of the nineteenth to twenty-first aspects, further including, after the separation, the step of bonding the buffer layer of the nitride semiconductor structure to a bonding layer on a second substrate.

A twenty-fifth aspect of the present invention is any one of the nineteenth to twenty-fourth aspects, wherein the second substrate is any one of a sapphire substrate, an electrically insulating substrate, a substrate obtained by depositing metal on an electrically insulating substrate, a semiconductor substrate, a substrate obtained by depositing metal on a semiconductor substrate, a metal substrate, a bendable substrate, and a substrate obtained by depositing metal on a bendable substrate.

A twenty-sixth aspect of the present invention is any one of the twenty-second to twenty-fifth aspects, wherein the bonding layer is any one of metal capable of providing thermal fusion bonding between the bonding layer and the nitride semiconductor structure and between the bonding layer and the second substrate, adhesive tape capable of providing chemical adhesion between the bonding layer and the nitride semiconductor structure and between the bonding layer and the second substrate, and an adhesive capable of providing chemical adhesion between the bonding layer and the nitride semiconductor structure and between the bonding layer and the second substrate.

A twenty-seventh aspect of the present invention is any one of the twenty-second to twenty-sixth aspects, wherein the bonding layer is conductive.

A twenty-eighth aspect of the present invention is a preparation method, including the steps of growing a buffer layer on a sapphire substrate, growing a double heterostructure on the buffer layer, and growing a wurtzite AlGaInBN thin film on the double heterostructure to prepare a nitride semiconductor structure, wherein the buffer layer includes any one of wurtzite AlN, a wurtzite GaN thin film, and a wurtzite AlGaN thin film, and the double heterostructure includes a wurtzite-structure $Al_xGa_{1-x}N$ (x>0) thin film, a graphite-structure boron nitride thin film, and a wurtzite-structure $Al_xGa_{1-x}N$ (x>0) thin film.

A twenty-ninth aspect of the present invention is the twenty-eighth aspect, wherein the graphite-structure boron nitride thin film is any one of a hexagonal boron nitride thin film and a turbostratic boron nitride thin film.

A thirtieth aspect of the present invention includes the steps of growing a buffer layer on a Si substrate, growing a double heterostructure on the buffer layer, and growing a wurtzite AlGaInBN thin film on the double heterostructure to prepare a nitride semiconductor structure, wherein the buffer layer includes a wurtzite AlN thin film, and the double heterostructure includes a wurtzite-structure $Al_xGa_{1-x}N$ (x>0) thin film, a graphite-structure boron nitride thin film, and a wurtzite-structure $Al_xGa_{1-x}N$ (x>0) thin film.

A thirty-first aspect of the present invention is the thirtieth aspect, wherein the graphite-structure boron nitride thin film is any one of a hexagonal boron nitride thin film and a turbostratic boron nitride thin film.

A thirty-second aspect of the present invention is a preparation method, including the steps of growing a double heterostructure on a SiC substrate, and growing a wurtzite AlGaInBN thin film on the double heterostructure to prepare a nitride semiconductor structure, wherein the buffer layer includes a wurtzite AlN thin film, and the double heterostructure includes a wurtzite-structure $Al_xGa_{1-x}N$ (x>0) thin film, a graphite-structure boron nitride thin film, and a wurtzite-structure $Al_xGa_{1-x}N$ (x>0) thin film.

A thirty-third aspect of the present invention is the thirty-second aspect, wherein the graphite-structure boron nitride thin film is any one of a hexagonal boron nitride thin film and a turbostratic boron nitride thin film.

Advantageous Effects of Invention

According to the present invention, by forming an Al-contained nitride semiconductor thin film as a buffer layer on an h-BN (hexagonal boron nitride) thin film or a t-BN (turbostratic boron nitride) thin film, which is a graphite-structure boron nitride thin film, a wurtzite-structure AlGaInBN nitride semiconductor structure such as GaN can be grown on the buffer layer. Moreover, the present invention can provide a method of preparing a nitride semiconductor structure including a wurtzite-structure AlGaInBN thin film on a sapphire substrate by an easier process than conventional techniques and a nitride semiconductor structure prepared by the same.

Moreover, according to the present invention, by employing a novel configuration as a buffer layer for growing a wurtzite-structure AlGaInBN thin film on a sapphire substrate, the buffer layer and the wurtzite-structure AlGaInBN thin film can be easily mechanically separated from the sapphire substrate. This can reduce process complexity, high cost, and the like of conventional techniques.

Moreover, according to the present invention, by growing a double heterostructure including a wurtzite-structure $Al_xGa_{1-x}N$ (x>0) thin film, a graphite-structure boron nitride thin film, and a wurtzite-structure $Al_xGa_{1-x}N$ (x>0) thin film on a buffer layer grown on a sapphire substrate first, a wurtzite AlGaInBN thin film made of GaN or the like can be grown on the double heterostructure. Moreover, by growing a double heterostructure including a wurtzite-structure $Al_xGa_{1-x}N$ (x>0) thin film, a graphite-structure boron nitride thin film, and a wurtzite-structure $Al_xGa_{1-x}N$ (x>0) thin film on a buffer layer grown on a Si substrate, a wurtzite AlGaInBN thin film made of GaN or the like can be grown on the double heterostructure. Further, by growing a double heterostructure including a wurtzite-structure $Al_xGa_{1-x}N$ (x>0) thin film, a graphite-structure boron nitride thin film, and a wurtzite-structure $Al_xGa_{1-x}N$ (x>0) thin film on a SiC substrate, a wurtzite AlGaInBN thin film made of GaN or the like can be grown on the double heterostructure. The above-described growth does not require other growth equipment than an MOCVD system, and therefore has a great economic advantage. Moreover, since the graphite-structure boron nitride thin film layer serves as a release layer, the wurtzite AlGaInBN thin film made of GaN or the like is mechanically separated from the sapphire substrate, the Si substrate, or the SiC substrate by applying a mechanical force. Accordingly, a chemical etching process and an etchant are unnecessary. In other words, this technique can provide a method of preparing, on a sapphire substrate, a Si substrate, or a SiC substrate, a nitride semiconductor structure including a wurtzite AlGaInBN thin film, which can be separated from the substrate, by an easier process than conventional techniques and a nitride semiconductor structure prepared by the same.

DESCRIPTION OF EMBODIMENTS

Figure 1:
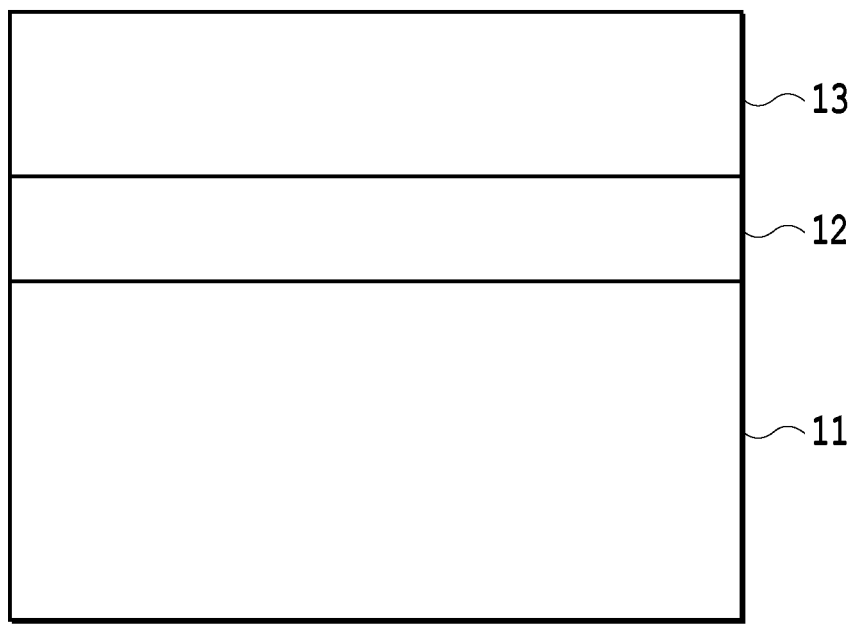
FIG. 1 is a view showing a conventional nitride semiconductor structure on a sapphire substrate.

Hereinafter, embodiments of the present invention will be described in detail with reference to the drawings.

A nitride semiconductor structure of the present invention is obtained by growing an h-BN thin film or a t-BN thin film and a wurtzite-structure $Al_xGa_{1-x}N$ (x>0) thin film as a buffer layer and forming a single-crystal wurtzite-structure AlGaInBN thin film on the buffer layer. The h-BN is a nitride similar to GaN, AlGaN, AlN, and the like, but has a completely different crystal structure. While GaN, AlGaN, AlN, and the like have the wurtzite structure with $sp^3$ bonds, the h-BN has the graphite structure with $sp^2$ bonds, and has a completely different crystal structure. Accordingly, it has heretofore not been considered that a wurtzite-structure AlGaInBN thin film can be grown on a graphite-structure h-BN thin film. For example, when a GaN thin film, which is a typical nitride semiconductor, is grown on an h-BN thin film, a single-crystal GaN thin film cannot be obtained, but a polycrystalline GaN thin film is obtained. The same is true of t-BN. However, when a wurtzite-structure $Al_xGa_{1-x}N$ (x>0) thin film is formed as a buffer layer on an h-BN thin film or a t-BN thin film, which is a graphite-structure boron nitride thin film, a wurtzite-structure AlGaInBN nitride semiconductor structure such as GaN can be grown on the buffer layer. Here, "AlGaInBN" includes binary nitride semiconductors GaN, AlN, InN, and BN, ternary nitride semiconductors AlGaN, InGaN, BGaN, AlInN, AlBN, and InBN, quaternary nitride semiconductors AlGaInN, AlGaBN, AlInBN, and GaInBN, and a quinary nitride semiconductor AlGaInBN.

After the wurtzite-structure AlGaInBN thin film is grown, the buffer layer and the wurtzite-structure AlGaInBN thin film on the buffer layer are mechanically separated from a sapphire substrate. The boron nitride thin film included in the buffer layer has a graphite-type crystal structure with layers bonded by van der Waals forces. Accordingly, the nitride semiconductor structure can be easily mechanically separated from the sapphire substrate.

In the case where a GaN thin film is grown as the wurtzite-structure AlGaInBN thin film, conventional laser lift-off processes perform separation by thermally decomposing GaN at the interface between the sapphire substrate and the GaN thin film using an excimer laser. Here, since the bond energy of GaN is approximately 2.2 eV, the temperature needs to be increased to 900° C. or more by laser irradiation to thermally decompose GaN. On the other hand, in the buffer layer according to the present invention, an h-BN thin film or a t-BN thin film is grown on the sapphire substrate. In the case of h-BN, layers in the boron nitride layer having $sp^2$ bonds are bonded to each other by van der Waals forces. The van der Waals bond energy is 70 meV, which is as low as 30/1 or less of the above-described bond energy of GaN having $sp^3$ bonds. Accordingly, the nitride semiconductor structure can be easily separated from the sapphire substrate by applying an external force in a certain way.

Then, the separated buffer layer and the wurtzite-structure AlGaInBN thin film on the buffer layer (hereinafter referred to as a "nitride semiconductor structure including a wurtzite-structure AlGaInBN thin film" in the present description) can be bonded and transferred to a second substrate. In other words, the wurtzite-structure AlGaInBN thin film, together with the buffer layer, is transferred to the second substrate.

The "second substrate" as a receptor substrate may be a sapphire substrate; an electrically insulating substrate made of glass or the like; a substrate obtained by depositing metal on an electrically insulating substrate; a semiconductor substrate made of silicon, silicon carbide, GaN, AlN, or the like; a substrate obtained by depositing metal on a semiconductor substrate; a metal substrate made of copper, silver, or the like; a bendable substrate made of plastic, paper, or the like; or a substrate obtained by depositing metal on plastic, paper, or the like.

The "nitride semiconductor structure including a wurtzite-structure AlGaInBN thin film" and the "second substrate" are bonded to each other with a bonding layer to perform transfer. The bonding layer may be, for example, metal such as copper or low melting point solder, tape such as conductive tape, or adhesive such as conductive adhesive. In the case of metal, the bonding layer and the nitride semiconductor structure, and the bonding layer and the second substrate, can be fusion-bonded by heating.

In the above explanation, the nitride semiconductor structure is transferred to the bonding layer on the second substrate after the separation. However, the nitride semiconductor structure may be bonded to the bonding layer on the second substrate first and then mechanically separated from the sapphire substrate. In particular, in this case, there is a great difference from conventional techniques in that a transparent electrically insulating substrate made of glass or the like, a bendable substrate made of plastic or the like, or a metal substrate such as an aluminum substrate can be used as the second substrate. In laser lift, which is a typical conventional technique, the temperature at the interface between the sapphire substrate and GaN locally reaches approximately 900° C., depending on a laser used. Accordingly, when a substrate such as described above is used as the second substrate, the substrate is deteriorated by heat, and therefore cannot be used. The present invention enables mechanical separation from the sapphire substrate at temperatures around room temperature, and enables a substrate such as described above to be used as a receptor substrate.

According to the present invention, first, the above-described buffer layer does not require the optimization, such as performed heretofore, of substrate temperature and film thickness for deposition. Moreover, the buffer layer is grown at a high temperature of, for example, not less than 1000° C., and therefore does not require increasing and reducing the substrate temperature. Thus, a growth program is greatly simplified.

Further, the h-BN thin film and the AlGaN thin film containing not less than 10% Al are semiconductors having band gaps in the range of 3.58 to 6.2 eV. In the case of an LED which emits light with wavelengths of not less than 346 nm, light emitted by the LED is not absorbed on the substrate side. Moreover, the buffer layer including the h-BN thin film or the t-BN thin film, and the wurtzite-structure $Al_xGa_{1-x}N$ (x>0) thin film is grown using an MOCVD system for nitride semiconductor growth. Accordingly, the buffer layer does not require other equipment than the MOCVD system, thus having a great economic advantage.

Moreover, the present invention does not require expensive equipment, which has heretofore been necessary for laser lift-off or chemical lift-off, thus having a great economic advantage.

Moreover, the present invention makes it possible to mechanically separate the above-described nitride semiconductor structure from the sapphire substrate without damage to the wurtzite-structure AlGaInBN thin film, and significantly simplifies a separation process compared to those of conventional laser lift-off and chemical lift-off. Further, this mechanical separation process can be performed in the air at room temperature. In this respect, also, the process can be simplified.

Moreover, the bonding layer is applied to or deposited on the second substrate as a receptor substrate to transfer the above-described nitride semiconductor structure. Even in the case where a large-area substrate is used as the second substrate as a receptor substrate, the bonding layer can be provided by only one process. Thus, productivity can be easily improved.

Furthermore, in the present invention, the wurtzite-structure AlGaInBN thin film can be transferred to a large-area substrate made of sapphire, silicon, or the like as well as metal having a high thermal conductivity, bendable plastic or paper, transparent glass, or the like. With such transfer, for example, light-emitting devices such as LEDs or LDs constructed using the wurtzite-structure AlGaInBN thin film can be transferred to a large-area or inexpensive, bendable (flexible) substrate to realize a ubiquitous society in which light-emitting devices can be used anywhere. Moreover, the transfer of high-frequency, high-output devices such as HEMTs constructed using the wurtzite-structure AlGaInBN thin film to a copper substrate or the like having a large thermal conductivity has the effect of greatly improving device characteristics thereof. Moreover, high-efficiency solar cells constructed using the wurtzite-structure AlGaInBN thin film can be used by being transferred onto a large-area or inexpensive, bendable substrate, transparent plastic or glass, or the like.

Moreover, without transferring the nitride semiconductor structure including a wurtzite-structure AlGaInBN thin film to a second substrate, it is also possible to deposit metal such as Ni/Au on the nitride semiconductor structure separated and then perform plating with Au of 100 μm thickness, which supports the separated nitride semiconductor structure.

Moreover, in the above explanation, bonding to a second substrate is performed using as a bonding surface the wurtzite-structure AlGaInBN thin film provided directly on the buffer layer. However, it should be noted that the present invention also includes the following aspects: a quantum well structure, an LED structure, a HEMT structure, or the like is provided on the wurtzite-structure AlGaInBN thin film provided directly on the buffer layer, and transfer is performed using as a bonding surface a second wurtzite-structure AlGaInBN thin film further provided on the wurtzite-structure AlGaInBN thin film, as in examples below.

Moreover, in a nitride semiconductor structure of the present invention, a double heterostructure including a wurtzite-structure $Al_xGa_{1-x}N$ (x>0) thin film, h-BN thin film, and a wurtzite-structure $Al_xGa_{1-x}N$ (x>0) thin film is grown, and a wurtzite AlGaInBN thin film is grown on the double heterostructure.

As described previously, GaN, AlGaN, AlN, and the like have completely different crystal structures from that of h-BN. Accordingly, it has heretofore not been considered that a double heterostructure having a graphite-structure h-BN thin film interposed between wurtzite-structure $Al_xGa_{1-x}N$ (x>0) thin films can be formed. However, by feeding ammonia and triethylboron as source materials into an MOCVD system and growing an h-BN thin film in the MOCVD system, a double-heterostructure thin film having an h-BN thin film interposed between wurtzite-structure $Al_xGa_{1-x}N$ (x>0) thin films can be grown, and a wurtzite AlGaInBN thin film can be grown on the double-heterostructure thin film.

Moreover, graphite-structure boron nitride is a layered material having layers bonded by van der Waals forces, each layer being formed by $sp^2$ bonds between B and N. Since the layers are bonded by van der Waals forces, the layers can be separated by applying a mechanical force thereto. Accordingly, in the case where a mechanical force is applied to one surface of a double-heterostructure thin film having an h-BN thin film interposed between wurtzite-structure $Al_xGa_{1-x}N$ (x>0) thin films, the h-BN layer in the double heterostructure serves as a release layer for separating the wurtzite-structure $Al_xGa_{1-x}N$ (x>0) thin films on opposite sides thereof.

First, the above-described double heterostructure is grown using an MOCVD system. Accordingly, the double heterostructure does not require other growth equipment than the MOCVD system, thus having a great economic advantage. Moreover, the double heterostructure can be grown at a temperature around 1000° C., and therefore does not require increasing and reducing the substrate temperature. Thus, a growth program is greatly simplified. Moreover, since the h-BN layer in the double heterostructure serves as a release layer as described above, the wurtzite AlGaInBN thin film can be mechanically separated from a sapphire substrate, a Si substrate, or a SiC substrate after growth. Thus, a chemical etchant and chemical etching are not required, and a separation process is greatly simplified.

Example 1

FIG. 1 shows a conventional nitride semiconductor structure on a sapphire substrate. First, (0001) sapphire substrate 11 was loaded into an MOCVD system, and thermal cleaning was performed in a hydrogen gas atmosphere at a reactor pressure of 300 Torr and a substrate temperature of 1080° C. Next, triethylboron and ammonia were fed to grow a (0001) h-BN thin film 12 at a substrate temperature of 1080° C. The film thickness of the h-BN thin film 12 was 3 nm. Next, trimethylgallium and ammonia were fed to grow wurtzite-structure GaN thin film 13 on the h-BN thin film 12 at a substrate temperature of 1050° C. The film thickness of the wurtzite-structure GaN thin film 13 was 0.6 μm.

Figure 2A:
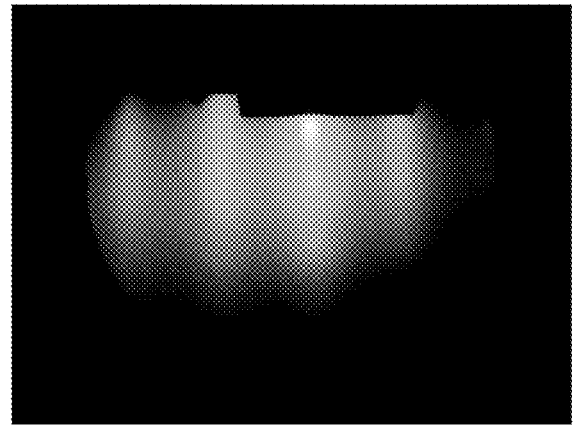
FIG. 2A shows a reflection high-energy electron diffraction (RHEED) pattern of a conventional h-BN thin film 12 grown on a sapphire substrate.
Figure 2B:
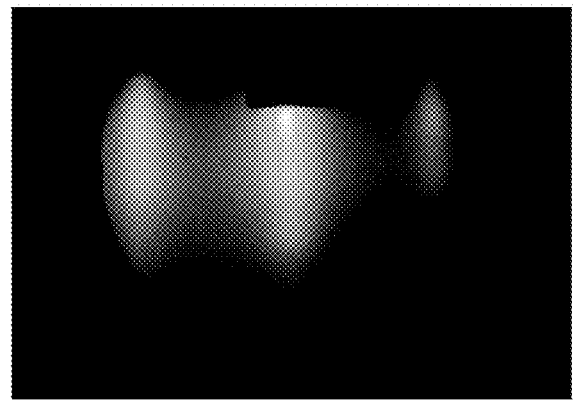
FIG. 2B shows a reflection high-energy electron diffraction (RHEED) pattern of the conventional h-BN thin film 12 grown on the sapphire substrate.

FIGS. 2A and 2B show reflection high-energy electron diffraction (RHEED) patterns of a conventional h-BN thin film 12 grown on a sapphire substrate. An electron beam was incident in the [1-100] and [11-20] directions of the sapphire substrate. RHEED indicates a (1×1) pattern, and an in-plane spacing calculated based on (1×1) is 1.25 Å. The a-axis lattice constant obtained from the spacing is 2.50 Å, which is equal to the a-axis lattice constant of h-BN. This indicates that (0001) h-BN was grown on the sapphire substrate, and that the in-plane orientational relationship between h-BN and sapphire is h-BN [11-20] ∥ sapphire [1-100].

Figure 3:
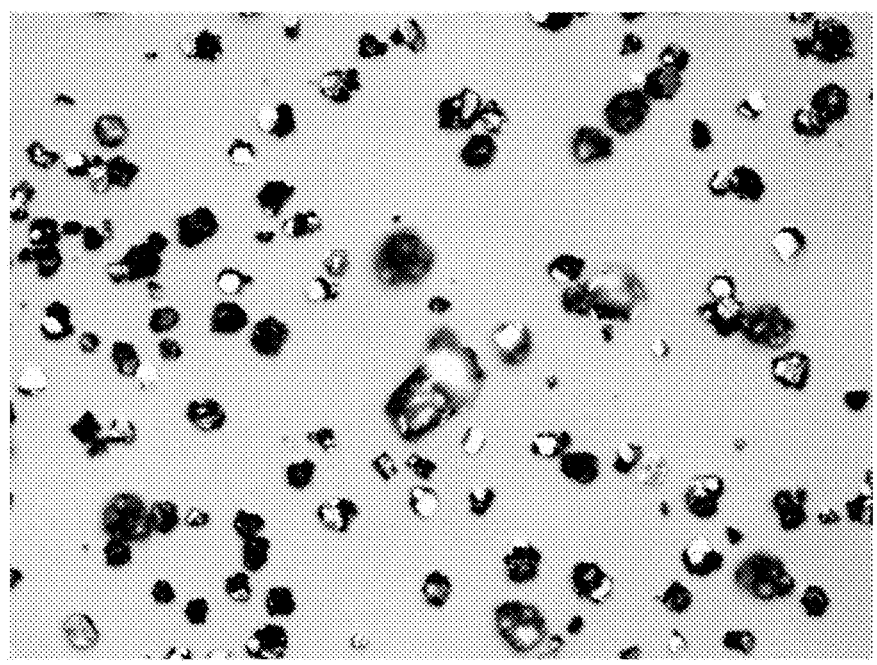
FIG. 3 is a photograph of the surface of a GaN thin film 13 shown in FIG. 1.

FIG. 3 is a photograph of the surface of the GaN thin film 13 shown in FIG. 1. Isolated GaN islands were formed, and have different orientations. Each of the GaN islands was not grown horizontally. The GaN thin film 13 is polycrystalline, and a planar surface was not able to be obtained.

Figure 4:
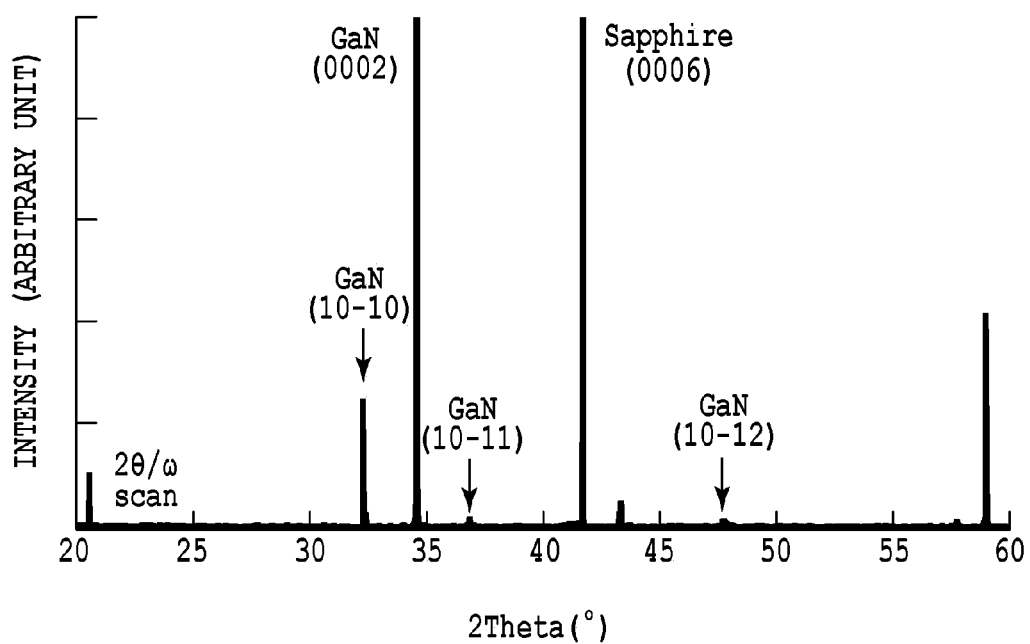
FIG. 4 shows the X-ray diffraction of the wurtzite-structure GaN thin film 13 grown on the h-BN thin film 12 shown in FIG. 1.

FIG. 4 shows the X-ray diffraction of the wurtzite-structure GaN thin film 13 grown on the h-BN thin film 12 shown in FIG. 1. In addition to diffraction from (0006) of the sapphire substrate 11, diffraction from (0002) of the wurtzite-structure GaN thin film 13 is clearly seen. However, other than the diffraction from (0002) of the wurtzite-structure GaN thin film 13, diffraction from (10-10), (10-11), and (10-12) of the wurtzite-structure GaN thin film 13 is seen. It was proved that the wurtzite-structure GaN thin film 13 is polycrystalline.

Figure 5:
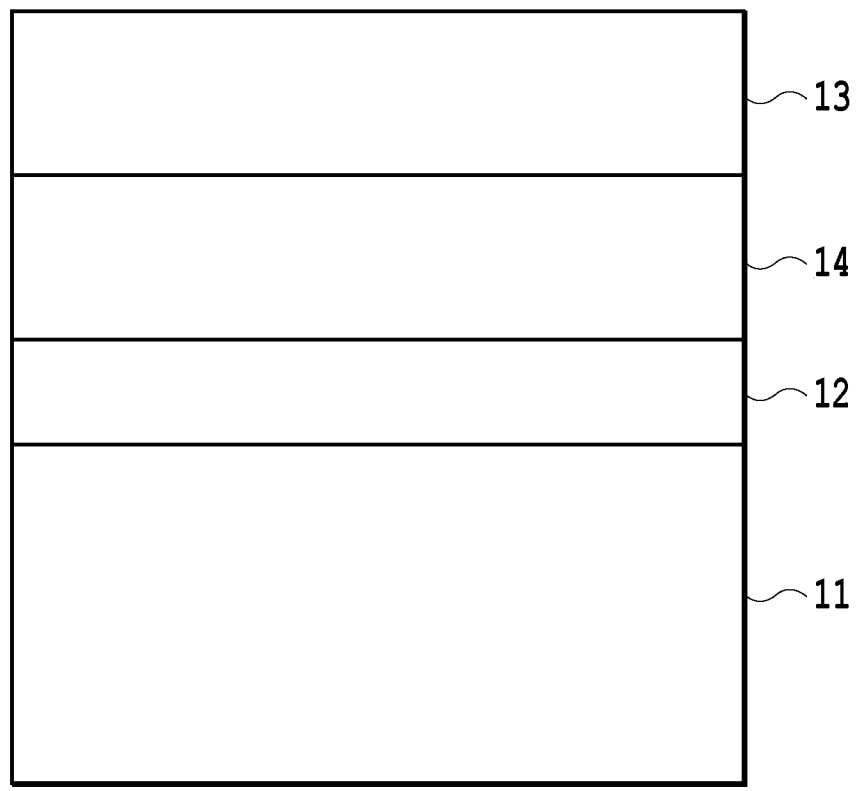
FIG. 5 is a view showing example 1 of a nitride semiconductor structure of the present invention.

FIG. 5 shows example 1 of a nitride semiconductor structure of the present invention. First, a (0001) sapphire substrate 11 was loaded into an MOCVD system, and thermal cleaning was performed in a hydrogen gas atmosphere at a reactor pressure of 300 Torr and a substrate temperature of 1080° C. Next, triethylboron and ammonia were fed to grow a (0001) h-BN thin film 12 at a substrate temperature of 1080° C. The film thickness of the h-BN thin film 12 was 3 nm. Next, trimethylaluminum, trimethylgallium, and ammonia were fed to grow a wurtzite-structure $Al_xGa_{1-x}N$ (x>0) thin film 14 on the h-BN thin film 12 at a substrate temperature of 1050°

C. The film thickness of the wurtzite-structure AlGaN thin film 14 was 0.3 µm. The h-BN thin film 12 and the wurtzite-structure AlGaN thin film 14 constitute a buffer layer. Trimethylgallium and ammonia were fed to grow a wurtzite-structure GaN thin film (corresponding to the "wurtzite-structure AlGaInBN thin film") 13 on this novel buffer layer at a substrate temperature of 1050° C. The film thickness of the wurtzite-structure GaN thin film 13 was 2.0 µm.

Figure 6:
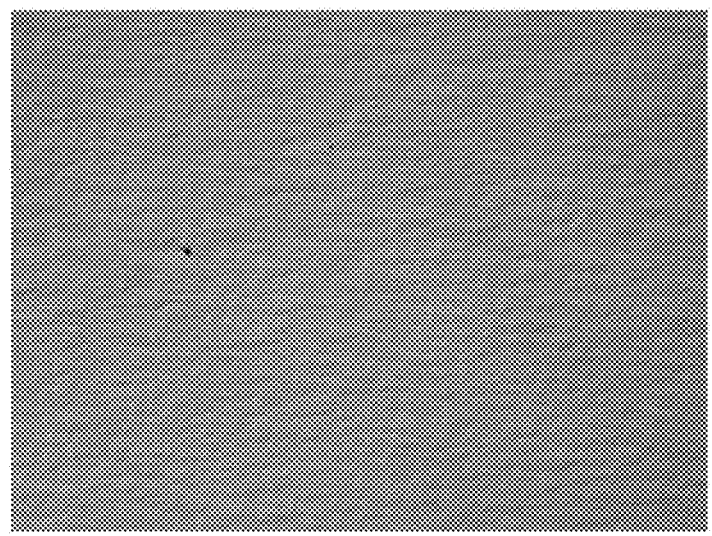
FIG. 6 is a photograph of the surface of a wurtzite-structure GaN thin film 13 shown in FIG. 5.

FIG. 6 is a photograph of the surface of the wurtzite-structure GaN thin film 13 shown in FIG. 5. As described previously, in the photograph (see FIG. 3) of the surface of the GaN thin film 13 shown in FIG. 1, isolated GaN islands having different orientations are formed, and the GaN thin film 13 is polycrystalline. Thus, a planar surface was not able to be obtained. In contrast to this, the wurtzite-structure GaN thin film 13 shown in FIG. 6 has a very planar surface. This result indicates that using the buffer layer including the h-BN thin film 12 and the AlGaN thin film 14, a planar, single-crystal wurtzite-structure GaN thin film 13 was able to be grown.

Figure 7:
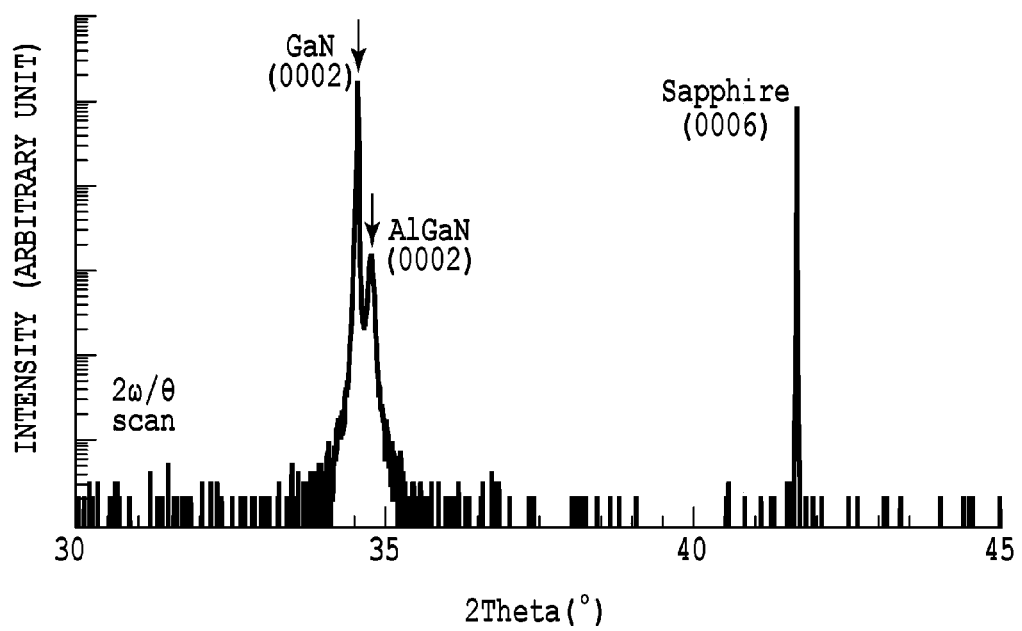
FIG. 7 shows the X-ray diffraction of the wurtzite-structure GaN thin film 13 shown in FIG. 5.

FIG. 7 shows the X-ray diffraction of the wurtzite-structure GaN thin film 13 shown in FIG. 5. Each of diffraction from (0002) of the wurtzite-structure GaN thin film 13 and diffraction from (0002) of the wurtzite-structure AlGaN thin film 14 included in the buffer layer was clearly seen. The c-axis lattice constant of the single-crystal GaN thin film 13 is 5.187 Å. This is close to the c-axis lattice constant of unstrained wurtzite-structure GaN, which is 5.1855 Å. The lattice strain along the c axis was found to be +0.0289%. It was proved that the c-axis lattice constant of the AlGaN thin film 14 included in the buffer layer is 5.154 Å, and that the AlGaN thin film 14 is an $Al_{0.16}Ga_{0.84}N$ thin film. This indicates that using the buffer layer including the h-BN thin film 12 and the wurtzite-structure $Al_xGa_{1-x}N$ (x>0) thin film 14, the single-crystal (0001) wurtzite-structure GaN thin film 13 was able to be grown on the sapphire substrate 11.

Figure 8:
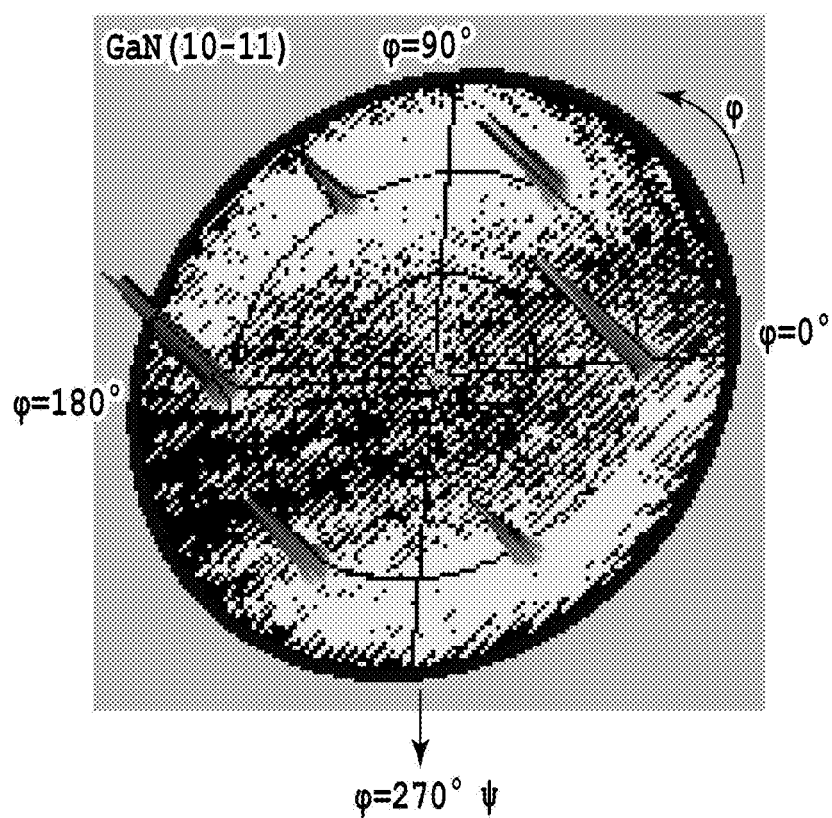
FIG. 8 is an X-ray diffraction pole figure of GaN (10-11) planes of the wurtzite-structure GaN thin film 13 shown in FIG. 5.

FIG. 8 is an X-ray diffraction pole figure of GaN (10-11) planes of the wurtzite-structure GaN thin film 13 shown in FIG. 5. From the fact that no diffraction peak is observed at ψ=0°, it can be seen that no inclined domain is formed. On the other hand, six clear GaN (10-11) diffraction peaks are observed. This indicates that there are no other rotational domains in the GaN thin film 13. From this X-ray diffraction pole figure, it can be seen that the in-plane orientational relationship between the sapphire substrate 11 and the wurtzite-structure GaN thin film 13 is sapphire [11-20] ∥ wurtzite-structure GaN [10-10].

The above-described surface observation, X-ray diffraction, and X-ray diffraction pole figure have revealed that though a GaN thin film which is a typical nitride semiconductor capable of being grown on an h-BN thin film has heretofore been a polycrystalline GaN thin film, the present invention makes it possible to grow a buffer layer including the h-BN thin film 12 and the wurtzite-structure AlGaN thin film 14 on the sapphire substrate 11 and grow the single-crystal wurtzite-structure GaN thin film 13 on the buffer layer.

Here, with regard to details of the novel buffer layer, results will be described. In the case where the thickness of the h-BN thin film 12 included in the buffer layer is equal to or more than that of a one-atom-thick layer, the planar, single-crystal wurtzite-structure GaN thin film 13 can be grown on the buffer layer including the h-BN thin film and the AlGaN thin film. Similarly, by employing a h-BN thin film instead of the h-BN thin film included in the buffer layer, the planar, single-crystal wurtzite-structure GaN thin film 13 can also be grown. In the case where the Al composition of the AlGaN thin film 14 included in the buffer layer is equal to or more than 10%, the planar, single-crystal wurtzite-structure GaN thin film 13 can be grown on the buffer layer including the h-BN thin film and the AlGaN thin film. Moreover, in the case where the film thickness of the AlGaN thin film 14 included in the buffer layer is equal to or more than 0.1 µm, the planar, single-crystal wurtzite-structure GaN thin film 13 can be grown on the buffer layer including the h-BN thin film and the AlGaN thin film. Further, the Al composition of the AlGaN thin film 14 included in the buffer layer may be graded from 10% to 0% in the direction from the h-BN thin film 12 to the single-crystal wurtzite-structure GaN thin film 13 to form a graded composition structure.

Finally, the wurtzite AlGaInBN thin film grown on the novel buffer c layer will be described. In the case where the Al composition of the AlGaN thin film 14 included in the buffer layer is not less than 10%, instead of the wurtzite-structure GaN thin film 13, a single-crystal, planar-surface wurtzite AlN or AlGaN thin film lattice-matched to the buffer layer was able to be grown on the buffer layer. Moreover, in the case where the Al composition of the AlGaN thin film 14 included in the buffer layer is not less than 10%, instead of the wurtzite-structure GaN thin film 13, a single-crystal, planar-surface wurtzite InAlN, AlGaInN, or AlGaInBN thin film which is lattice-matched to the buffer layer or which has a lattice mismatch of not more than 3% was also able to be grown on the buffer layer.

Example 2

Figure 9:
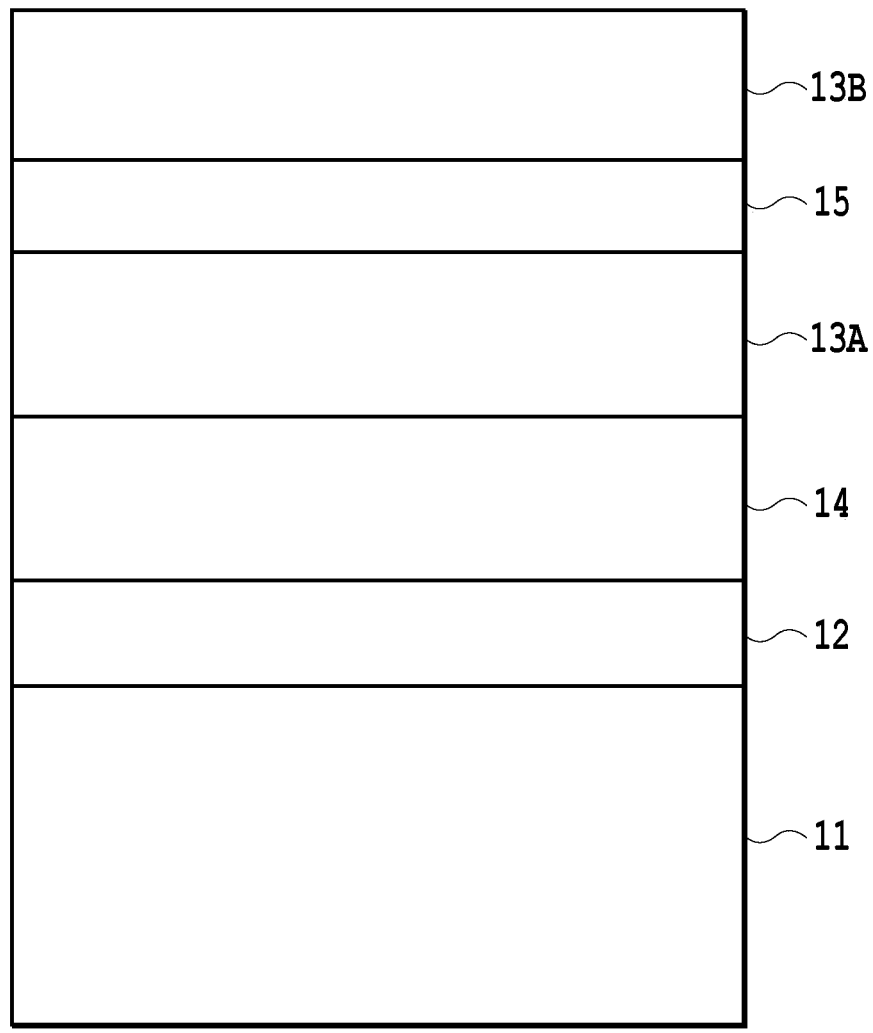
FIG. 9 is a view showing example 2 of a nitride semiconductor structure of the present invention.

FIG. 9 shows example 2 of a nitride semiconductor structure of the present invention. First, a (0001) sapphire substrate 11 was loaded into an MOCVD system, and thermal cleaning was performed in a hydrogen gas atmosphere at a reactor pressure of 300 Torr and a substrate temperature of 1080° C. Next, triethylboron and ammonia were fed to grow a (0001) h-BN thin film 12 at a substrate temperature of 1080° C. The film thickness of the h-BN thin film 12 was 3 nm. Next, trimethylaluminum, trimethylgallium, and ammonia were fed to grow a wurtzite-structure $Al_{0.16}Ga_{0.84}N$ thin film 14 on the h-BN thin film 12 at a substrate temperature of 1050° C. The film thickness of the wurtzite-structure $Al_{0.16}Ga_{0.84}N$ thin film 14 was 0.3 µm. In this way, a buffer layer including the h-BN thin film 12 and the AlGaN thin film 14 is grown on the sapphire substrate 11, and an InGaN quantum well structure is grown thereon. Trimethylgallium and ammonia were fed to grow a wurtzite-structure GaN thin film (corresponding to the "wurtzite-structure AlGaInBN thin film") 13A on the novel buffer layer at a substrate temperature of 1050° C. The film thickness of the wurtzite-structure GaN thin film 13A was 2.2 µm. Next, the substrate temperature was reduced to 730° C., and an InGaN/GaN multiple-quantum-well structure 15 was grown on the single-crystal GaN thin film 13A using trimethylindium, triethylgallium, and ammonia. The thickness of each InGaN well layer was 3 nm, and 10 quantum wells were grown. Then, the substrate temperature was increased to 1050° C. again, and a wurtzite-structure GaN thin film (corresponding to the "second wurtzite-structure AlGaInBN thin film") 13B was grown as a cap layer.

Figure 10:
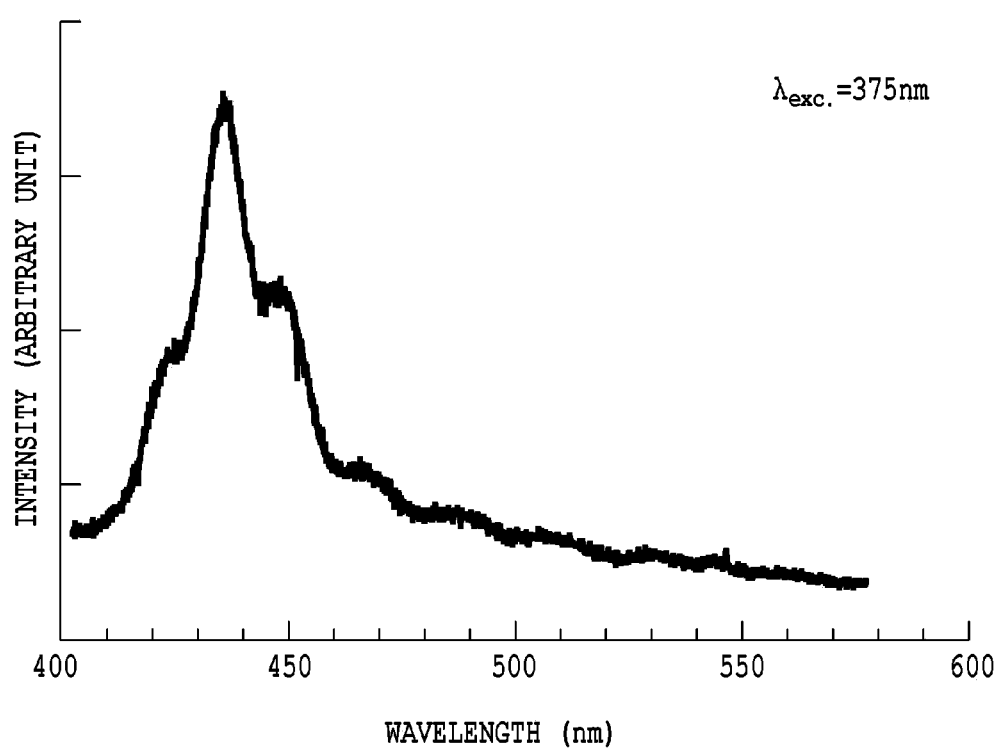
FIG. 10 shows a photoluminescence spectrum of the structure shown in FIG. 9.

FIG. 10 shows a photoluminescence spectrum of the structure shown in FIG. 9. To excite only the InGaN/GaN multiple-quantum-well structure 15, an ultraviolet laser having an excitation wavelength of 375 nm was used. Temperature during measurement was room temperature, and excitation intensity was 500 µW. Heretofore, a GaN thin film grown on an h-BN thin film has been a polycrystalline GaN thin film, and no photoluminescence is observed from an InGaN/GaN multiple-quantum-well structure grown on the polycrystal.

However, in the structure shown in FIG. 9, light emitted from the InGaN/GaN multiple-quantum-well structure 15 was clearly observed at a emission wavelength of 435 nm. Moreover, fringes caused by surface planarity were observed in the photoluminescence spectrum.

The above-described photoluminescence has proved that it is possible to grow a buffer layer including the h-BN thin film 12 and the wurtzite-structure AlGaN thin film 14 on the sapphire substrate 11 and grow the InGaN/GaN multiple-quantum-well structure 15 on the single-crystal wurtzite-structure GaN thin film 13A grown on the buffer layer. Heretofore, a GaN thin film which is a typical nitride semiconductor grown on an h-BN thin film has been a polycrystalline GaN thin film, and an InGaN/GaN multiple-quantum-well structure has been incapable of being grown.

Here, with regard to details of the novel buffer layer, results will be described. In the case where the thickness of the h-BN thin film 12 included in the buffer layer is equal to or more than that of a one-atom-thick layer, the InGaN/GaN multiple-quantum-well structure 15 can be grown on the buffer layer including the h-BN thin film and the AlGaN thin film. Similarly, by employing a t-BN thin film instead of the h-BN thin film included in the buffer layer, the InGaN/GaN multiple-quantum-well structure 15 can also be grown. In the case where the Al composition of the AlGaN thin film 14 included in the buffer layer is equal to or more than 10%, the InGaN/GaN multiple-quantum-well structure 15 can be grown on the buffer layer including the h-BN thin film and the AlGaN thin film. Moreover, in the case where the film thickness of the AlGaN thin film 14 included in the buffer layer is equal to or more than 0.1 μm, the InGaN/GaN multiple-quantum-well structure 15 can be grown on the buffer layer including the h-BN thin film and the AlGaN thin film. Further, the Al composition of the AlGaN thin film 14 included in the buffer layer may be graded from 10% to 0% in the direction from the h-BN thin film 12 to the single-crystal wurtzite-structure GaN thin film 13A to form a graded composition structure.

Example 3

Figure 11:
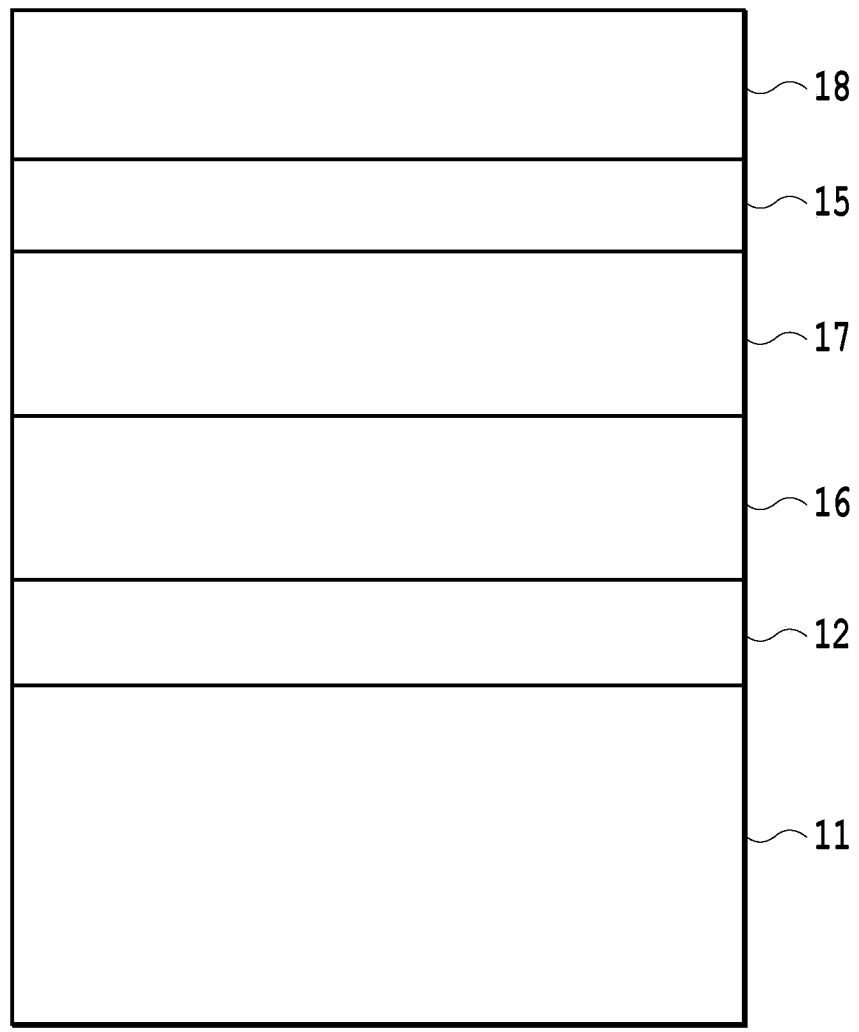
FIG. 11 is a view showing example 3 of a nitride semiconductor structure of the present invention.

FIG. 11 shows example 3 of a nitride semiconductor structure of the present invention. First, a (0001) sapphire substrate 11 was loaded into an MOCVD system, and thermal cleaning was performed in a hydrogen gas atmosphere at a reactor pressure of 300 Torr and a substrate temperature of 1080° C. Next, triethylboron and ammonia were fed to grow a (0001) h-BN thin film 12 at a substrate temperature of 1080° C. The film thickness of the h-BN thin film 12 was 3 nm. Next, trimethylaluminum, trimethylgallium, ammonia, and silane were fed to grow a Si-doped wurtzite-structure $Al_{0.2}Ga_{0.8}N$ thin film 16 as an n-type AlGaN thin film on the h-BN thin film 12 at a substrate temperature of 1050° C. The film thickness of the Si-doped wurtzite-structure AlGaN thin film 16 was 0.3 μm. In this way, a buffer layer including the h-BN thin film 12 and the Si-doped $Al_{0.2}Ga_{0.8}N$ thin film 16 is grown on the sapphire substrate 11, and an LED structure is grown thereon. Trimethylgallium, ammonia, and silane were fed to grow a Si-doped wurtzite-structure GaN thin film (corresponding to the "wurtzite-structure AlGaInBN thin film") 17 as an n-type GaN thin film 17 on the Si-doped wurtzite-structure $Al_{0.2}Ga_{0.8}N$ thin film 16 at a substrate temperature of 1050° C. The film thickness of the Si-doped wurtzite-structure GaN thin film 17 was 2.0 μm. Next, the substrate temperature was reduced to 730° C., and an InGaN/GaN multiple-quantum-well structure 15 was grown on the Si-doped wurtzite-structure GaN thin film 17 using triethylindium, triethylgallium, and ammonia. The thickness of each InGaN well layer was 3 nm, and 10 quantum wells were grown. Then, the substrate temperature was increased to 1050° C. again, and a Mg-doped wurtzite-structure GaN thin film (corresponding to the "second wurtzite-structure AlGaInBN thin film") 18 was grown as a p-type GaN thin film using trimethylgallium, ammonia, and cyclopentadienyl magnesium. The film thickness of the Mg-doped wurtzite-structure GaN thin film 18 was 0.2 μm.

A Hall effect measurement indicates that the Si-doped wurtzite-structure GaN thin film 17 is n-type and has a carrier concentration of $2\times10^{18}$ cm$^{-3}$ and a mobility of 160 cm$^2$/Vs, and that the Mg-doped wurtzite-structure GaN thin film 18 is p-type and has a carrier concentration of $1\times10^{17}$ cm$^{-3}$ and a mobility of 8 cm$^2$/Vs.

Figure 12:
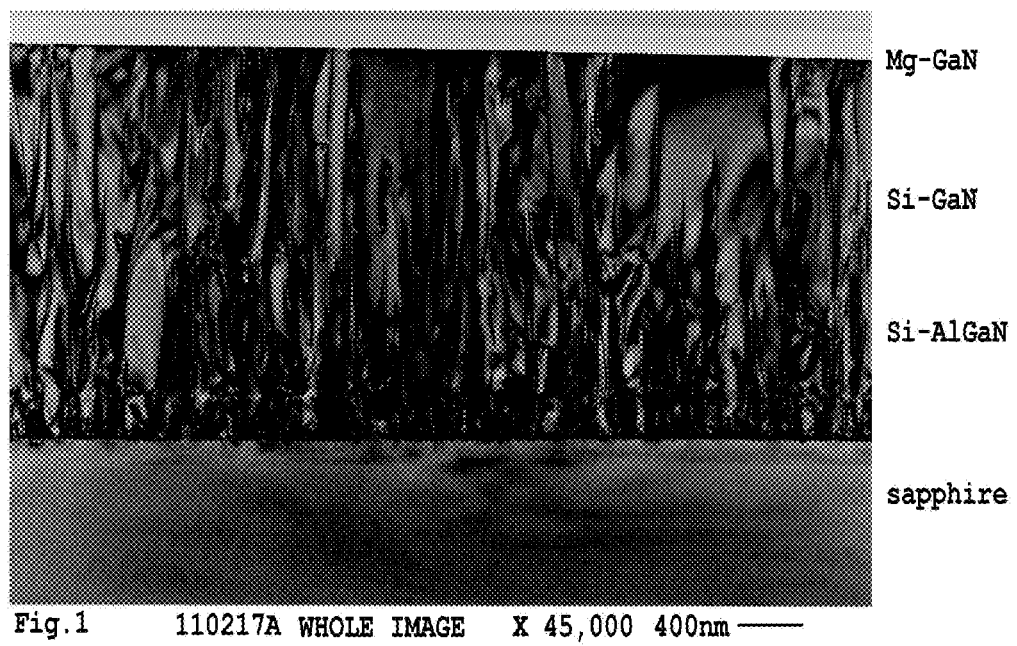
FIG. 12 is a cross-sectional transmission electron microscopy (TEM) image of the structure shown in FIG. 11.

FIG. 12 is a cross-sectional transmission electron microscopy (TEM) image of the structure shown in FIG. 11. The Si-doped $Al_{0.2}Ga_{0.8}N$ thin film 16 is seen to be formed on the sapphire substrate 11, and it can be seen that the Si-doped wurtzite-structure GaN thin film 17 and the Mg-doped wurtzite-structure GaN thin film 18, which have a total film thickness of 2.0 μm, formed on the Si-doped $Al_{0.2}Ga_{0.8}N$ thin film 16.

Here, with regard to details of the novel buffer layer, results will be described. In the case where the thickness of the h-BN thin film 12 included in the buffer layer is equal to or more than that of a one-atom-thick layer, the above-described LED structure can be grown on the buffer layer including the h-BN thin film and the AlGaN thin film. Similarly, by employing a t-BN thin film instead of the h-BN thin film included in the buffer layer, the above-described LED structure can also be grown. In the case where the Al composition of the AlGaN thin film 16 included in the buffer layer is equal to or more than 10%, the above-described LED structure can be grown on the buffer layer including the h-BN thin film and the AlGaN thin film. Moreover, in the case where the film thickness of the AlGaN thin film 16 included in the buffer layer is equal to or more than 0.1 μm, the above-described LED structure can be grown on the buffer layer including the h-BN thin film and the AlGaN thin film. Further, the Al composition of the AlGaN thin film 16 included in the buffer layer may be graded from 10% to 0% in the direction from the h-BN thin film 12 to the single-crystal wurtzite-structure GaN thin film 17 to form a graded composition structure.

Example 4

Figure 13:
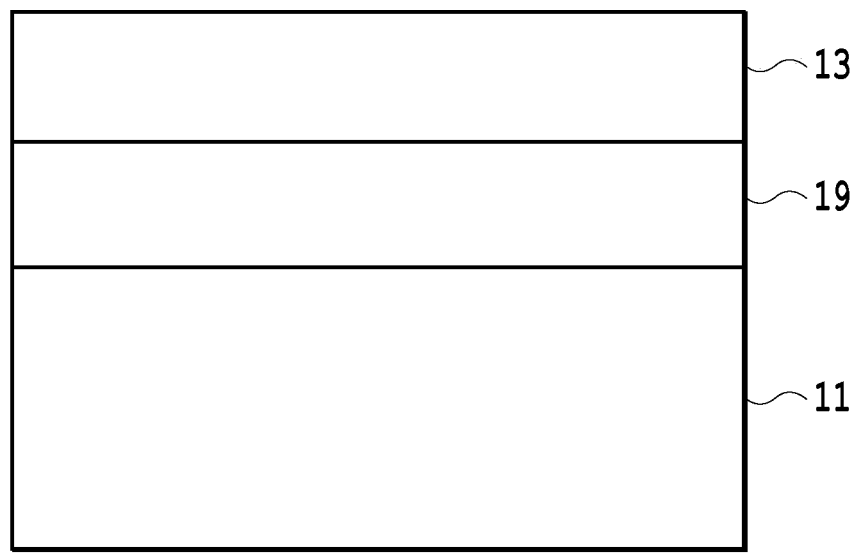
FIG. 13 is a view showing a conventional nitride semiconductor structure provided on a sapphire substrate.

FIG. 13 shows a conventional nitride semiconductor structure provided on a sapphire substrate. First, a (0001) sapphire substrate 11 was loaded into an MOCVD system, and thermal cleaning was performed in a hydrogen gas atmosphere at a reactor pressure of 300 Torr and a substrate temperature of 1080° C. Next, trimethylgallium and ammonia were fed to grow a low-temperature GaN buffer layer 19 having a film thickness of 20 nm at a substrate temperature of 550° C. Then, the substrate temperature was increased to 1050° C., and trimethylgallium and ammonia were fed to grow a wurtzite-structure GaN thin film 13. The film thickness of the wurtzite-structure GaN thin film 13 was 1 μm.

Figure 14:
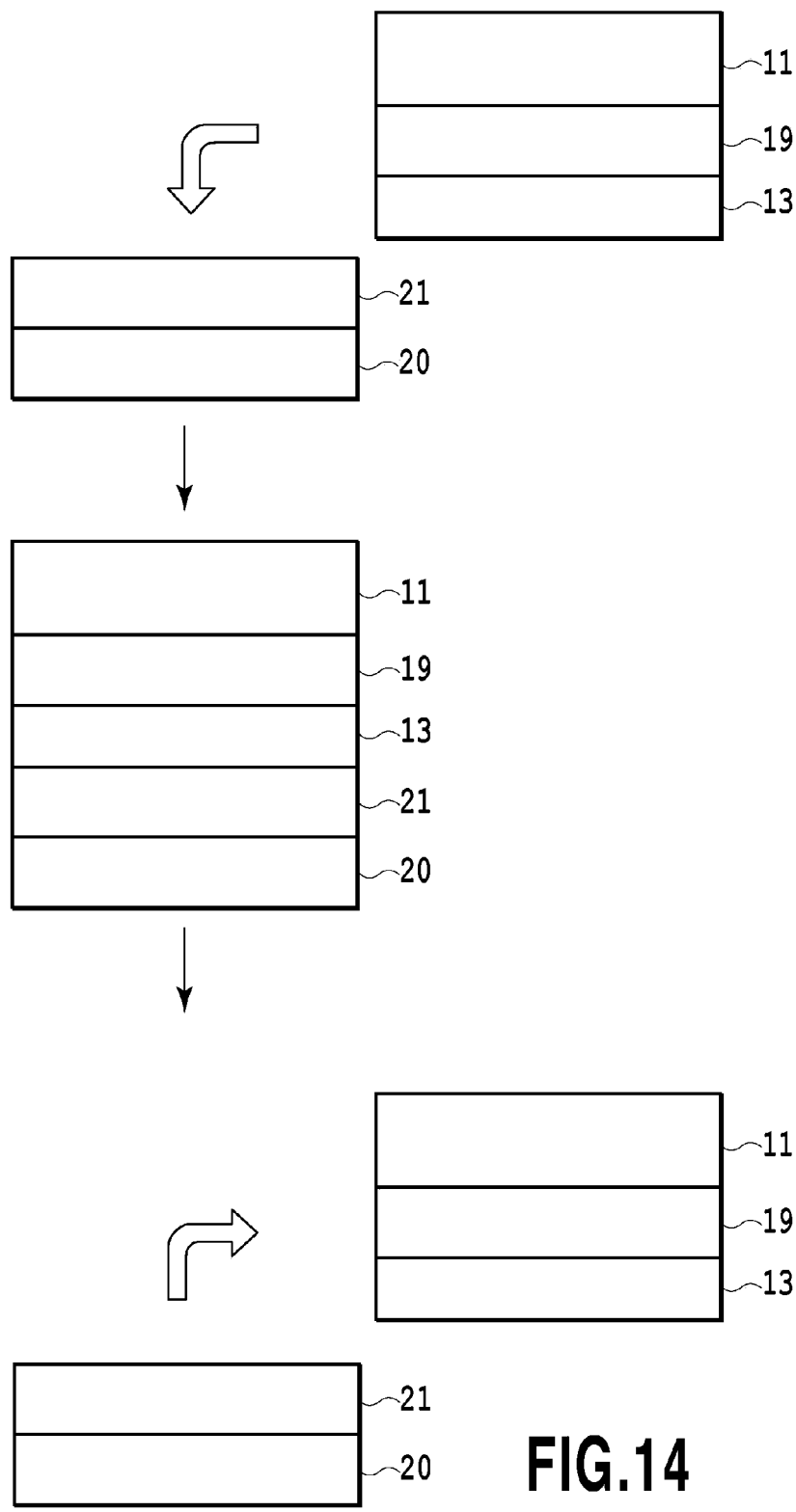
FIG. 14 is a view showing a conventional nitride semiconductor structure and a result of the transfer thereof.

Next, the separation of the wurtzite-structure GaN thin film 13 from the sapphire substrate 11 and the transfer of the wurtzite-structure GaN thin film 13 to a second substrate will be described with reference to FIG. 14. Conductive double-sided adhesive tape 21 was attached to a receptor sapphire substrate 20, and the wurtzite-structure GaN thin film 13, together with the sapphire substrate 11 and the low-temperature GaN buffer layer 19, was attached to the conductive double-sided adhesive tape 21 with the wurtzite-structure GaN thin film 13 serving as a bonding surface. An attempt to mechanically separate the wurtzite-structure GaN thin film 13 from the sapphire substrate 11 was unsuccessful. The wurtzite-structure GaN thin film 13 on the sapphire substrate 11 and the low-temperature GaN buffer layer 19 form chemically strong covalent bonds therebetween. Although the wurtzite-structure GaN thin film 13 is physically bonded to the conductive double-sided adhesive tape 21 with adhesive, the bonding forces thereof are weak compared to those of the above-described covalent bonds. Accordingly, the wurtzite-structure GaN thin film 13 on the conductive double-sided adhesive tape 21 cannot be separated from the sapphire substrate 11. When an attempt to separate the wurtzite-structure GaN thin film 13 from the sapphire substrate 11 was made, the wurtzite-structure GaN thin film 13, together with the sapphire substrate 11, was separated from the conductive double-sided adhesive tape 21 and was able to be transferred onto the conductive double-sided adhesive tape 21. Such a structure requires a conventional laser lift-off or chemical lift-off technique.

Figure 15:
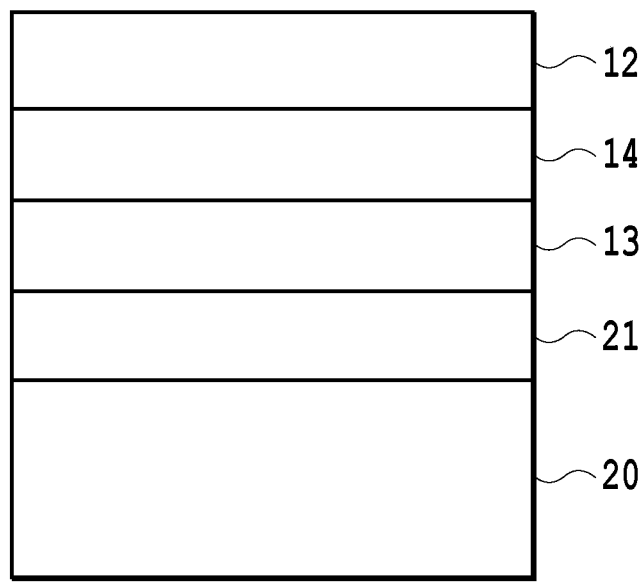
FIG. 15 is a view showing example 4 of a nitride semiconductor structure including a wurtzite-structure AlGaInBN thin film prepared by a preparation method of the present invention.

FIG. 15 shows example 4 of a nitride semiconductor structure including a wurtzite-structure AlGaInBN thin film prepared by a preparation method of the present invention. Conductive double-sided adhesive tape (corresponding to the "bonding layer") 21 is on a sapphire substrate (corresponding to the "second substrate") 20. Transferred onto the conductive double-sided adhesive tape 21 are a wurtzite-structure GaN thin film (corresponding to the "wurtzite-structure AlGaInBN thin film") 13, a wurtzite-structure $Al_xGa_{1-x}N$ (x>0) thin film 14 on the wurtzite-structure GaN thin film 13, and an h-BN thin film (corresponding to the "graphite-structure boron nitride thin film") 12 which have been separated from a sapphire substrate 11.

Figure 16:
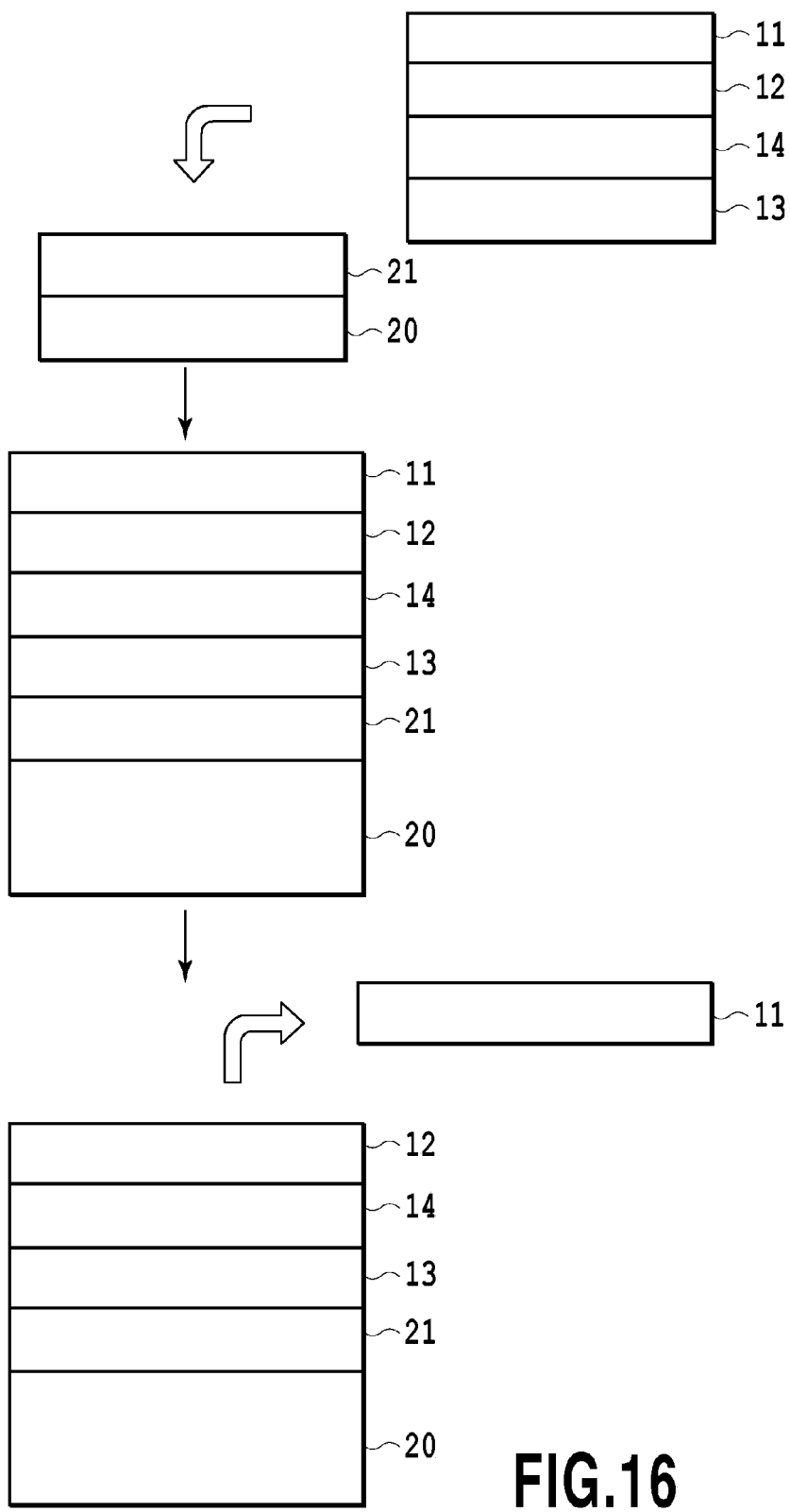
FIG. 16 is a view for explaining the preparation method of example 4.

Referring to FIG. 16, the preparation method of the present invention will be described. First, the sapphire substrate 11 was loaded into an MOCVD system, and thermal cleaning was performed in a hydrogen gas atmosphere at a reactor pressure of 300 Torr and a substrate temperature of 1080° C.

Next, triethylboron and ammonia were fed to grow the h-BN thin film 12 at a substrate temperature of 1080° C. The film thickness of the h-BN thin film 12 is 3 nm.

Next, trimethylgallium, trimethylaluminum, and ammonia were fed to grow the wurtzite-structure $Al_{0.16}Ga_{0.84}N$ thin film 14 on the h-BN thin film 12 at a substrate temperature of 1050° C. and grow the wurtzite-structure GaN thin film 13 on the wurtzite-structure $Al_{0.16}Ga_{0.84}N$ thin film 14 at a substrate temperature of 1050° C. The film thicknesses of the wurtzite-structure AlGaN thin film 14 and the wurtzite-structure GaN thin film 13 are 0.3 μm and 2.0 μm, respectively. Since the h-BN thin film 12 has a graphite-type crystal structure with $sp^2$ bonds, and the wurtzite-structure GaN thin film 13 has a wurtzite-type crystal structure with $sp^3$ bonds, it has heretofore not been possible to grow the single-crystal wurtzite-structure GaN thin film 13 on the h-BN thin film 12. The present inventors have found that it is possible to grow the single-crystal wurtzite-structure AlGaN thin film 14 on the h-BN thin film 12 and grow the single crystal wurtzite-structure GaN thin film 13 thereon. In the case where the thickness of the h-BN thin film 12 is equal to or more than that of a one-atom-thick layer, the planar, single-crystal wurtzite-structure GaN thin film 13 can be grown. Moreover, by using a t-BN thin film instead of the h-BN thin film 12, the planar, single-crystal wurtzite-structure GaN thin film 13 can also be grown. In the case where the Al composition of the AlGaN thin film 14 included in the buffer layer is equal to or more than 10%, the single-crystal wurtzite-structure GaN thin film 13 can be grown on the buffer layer including the h-BN thin film and the AlGaN thin film. Moreover, in the case where the film thickness of the AlGaN thin film 14 included in the buffer layer is equal to or more than 0.1 μm, the single-crystal wurtzite-structure GaN thin film 13 can be grown on the buffer layer including the h-BN thin film and the AlGaN thin film. Further, the Al composition of the AlGaN thin film 14 included in the buffer layer may be graded from 10% to 0% in the direction from the h-BN thin film 12 to the single-crystal wurtzite-structure GaN thin film 13 to form a graded composition structure.

Next, referring again to FIG. 16, a method of transferring the nitride semiconductor structure including a wurtzite-structure AlGaInBN thin film will be described. Conductive double-sided adhesive tape 21 was attached to a receptor sapphire substrate 20, and the above-described nitride semiconductor structure separated was attached to the conductive double-sided adhesive tape 21 with the wurtzite-structure GaN thin film 13 serving as a bonding surface. When an attempt was made to mechanically separate this nitride semiconductor structure from the conductive double-sided adhesive tape 21, the single-crystal wurtzite-structure GaN thin film 13, the single-crystal wurtzite-structure AlGaN thin film 14, and the h-BN thin film 12 were separated from the sapphire substrate 11, and bonded and transferred to the conductive double-sided adhesive tape 21 on the sapphire substrate 20. The above-described nitride semiconductor structure on the sapphire substrate 11 is bonded to the sapphire substrate 11 with the h-BN thin film 12 having layers bonded by van der Waals forces. The single-crystal wurtzite-structure GaN thin film 13 is physically bonded to the conductive double-sided adhesive tape 21 with adhesive, and the bonding forces thereof are strong compared to the above-described van der Waals forces. The size of a sample transferred was approximately 5 mm square.

Figure 17:
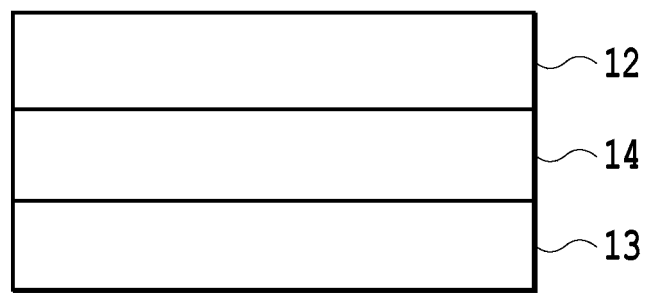
FIG. 17 is a view showing the nitride semiconductor structure of example 4.

Moreover, the nitride semiconductor structure shown in FIG. 17 which includes the single-crystal wurtzite-structure GaN thin film 13, the single-crystal wurtzite-structure AlGaN thin film 14, and the h-BN thin film 12 can also be removed by using tweezers or the like, not by transfer.

Hereinafter, using experimental data, it will be proved that the preparation method of the present invention enables the h-BN thin film 12, the single-crystal wurtzite-structure AlGaN thin film 14, and the single-crystal wurtzite-structure GaN thin film 13 to be separated from the sapphire substrate 11 with high-quality crystallinity maintained, and bonded and transferred to the conductive double-sided adhesive tape 21.

On the surface of the single-crystal wurtzite-structure AlGaN thin film 14 of the above-described nitride semiconductor structure transferred according to the present invention shown in FIG. 15, cracks and the like were not observed in a 2- to 3-mm region in an observation using an optical microscope, and the surface was planar. By X-ray diffraction, Raman scattering, and cathodoluminescence, an evaluation was made as to whether the crystallinities of the single-crystal wurtzite-structure GaN thin film 13 and the single-crystal wurtzite-structure AlGaN thin film 14 transferred were approximately the same as those before transfer.

Figure 18:
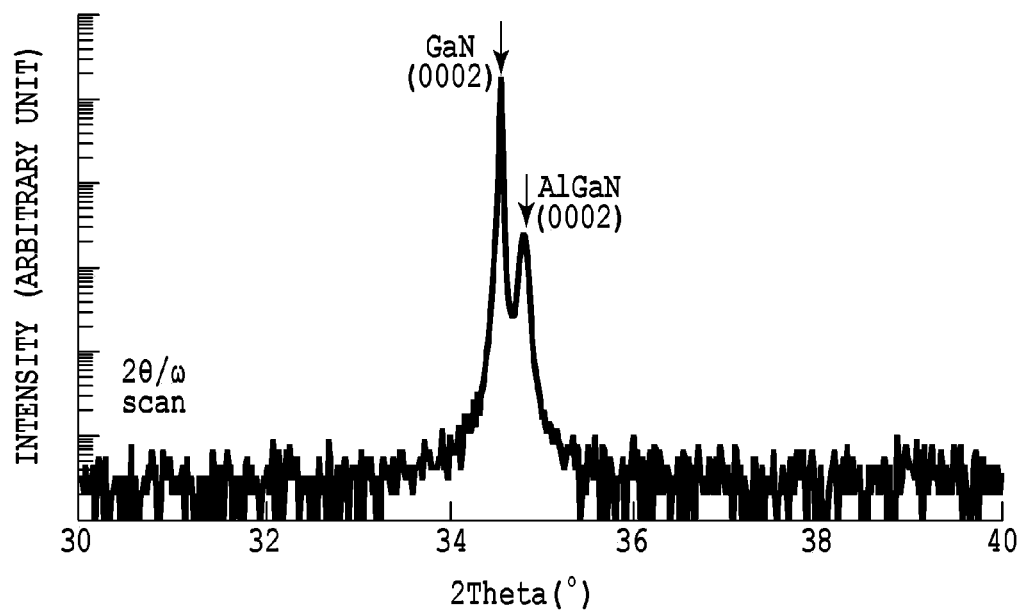
FIG. 18 is a view showing the X-ray diffraction of a single-crystal wurtzite-structure AlGaN thin film 14 of example 4.

First, FIG. 18 shows the X-ray diffraction of the single-crystal wurtzite-structure AlGaN thin film 14 of the nitride semiconductor structure transferred by the preparation method of the present invention shown in FIG. 16. Similar to the X-ray diffraction of the nitride semiconductor structure before transfer, each of diffraction from (0002) of the wurtzite-structure GaN thin film 13 and diffraction from (0002) of the wurtzite-structure AlGaN thin film 14 was clearly observed. The c-axis lattice constant of the single-crystal wurtzite-structure GaN thin film 13 transferred is 5.1855 Å. This is close to the c-axis lattice constant of unstrained wurtzite-structure GaN, which is 5.1855 Å. It was proved that the transfer made the single-crystal wurtzite-structure GaN thin film 13 unstrained.

Figure 19:
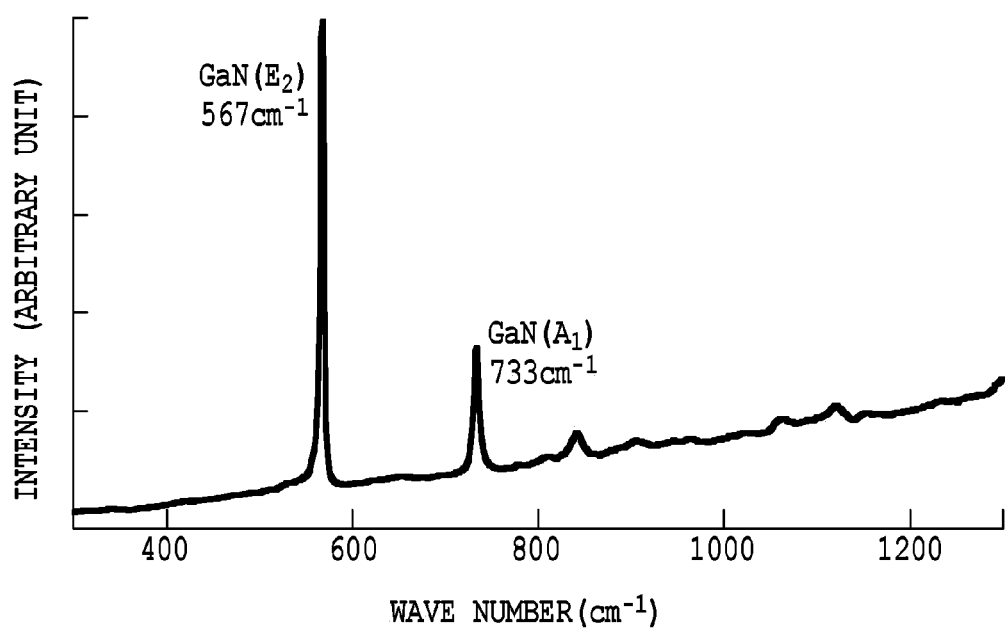
FIG. 19 is a view showing a Raman scattering spectrum of a single-crystal wurtzite-structure GaN thin film 13 of example 4.

Next, FIG. 19 shows a Raman scattering spectrum of the single-crystal wurtzite-structure GaN thin film 13 of the nitride semiconductor structure transferred by the preparation method of the present invention shown in FIG. 16. Similar to Raman scattering before transfer, the E2 and A1 modes of the wurtzite-structure GaN thin film 13 were clearly observed at 567 $cm^{-1}$ and 734 $cm^{-1}$, respectively. These are almost the same as those for the E2 and A1 modes of an unstrained GaN thin film, which are 567 $cm^{-1}$ and 734 $cm^{-1}$, respectively. This proved that the single-crystal wurtzite-structure GaN thin film 13 is made unstrained by being transferred onto the conductive double-sided adhesive tape 21.

Figure 20:
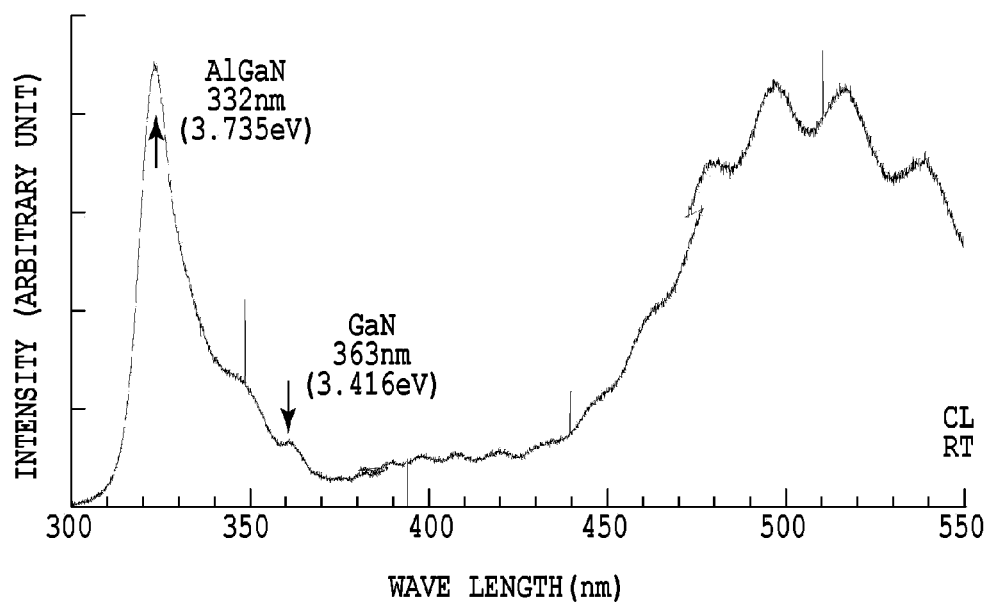
FIG. 20 is a view showing a cathodoluminescence spectrum of the single-crystal wurtzite-structure GaN thin film 13 and the single-crystal wurtzite-structure AlGaN thin film 14 of example 4.

Next, FIG. 20 shows a cathodoluminescence spectrum of the single-crystal wurtzite-structure GaN thin film 13 and the single-crystal wurtzite-structure AlGaN thin film 14 of the nitride semiconductor structure transferred by the preparation method of the present invention shown in FIG. 16. A cathodoluminescence measurement was performed at room temperature at an acceleration voltage of 10 kV. Luminescence from the single-crystal wurtzite-structure AlGaN thin film 14 is clearly observed at 332 nm, and luminescence from the single-crystal wurtzite-structure GaN thin film 13 is also observed around 363 nm.

The above-described surface observation using an optical microscope, X-ray diffraction, Raman scattering, and cathodoluminescence proved that the h-BN thin film 12, the single-crystal wurtzite-structure AlGaN thin film 14, and the single-crystal wurtzite-structure GaN thin film 13 are separated from the sapphire substrate 11 and transferred onto the conductive double-sided adhesive tape 21 with high-quality crystallinity maintained.

Finally, the wurtzite AlGaInBN thin film grown on the buffer layer according to the present invention will be described. In the case where the Al composition of the wurtzite-structure $Al_xGa_{1-x}N$ (x>0) thin film 14 included in the buffer layer is equal to or more than 10%, instead of the wurtzite-structure GaN thin film 13, a single-crystal, planar-surface wurtzite AlN or AlGaN thin film lattice-matched to the buffer layer was able to be grown on the buffer layer.

Moreover, in the case where the Al composition of the wurtzite-structure $Al_xGa_{1-x}N$ (x>0) thin film 14 included in the buffer layer is equal to or more than 10%, instead of the wurtzite-structure GaN thin film 13, a single-crystal, planar-surface wurtzite InAlN, AlGaInN, or AlGaInBN thin film which is lattice-matched to the buffer layer or which has a lattice mismatch of not more than 3% can also be grown on the buffer layer.

Example 5

Figure 21:
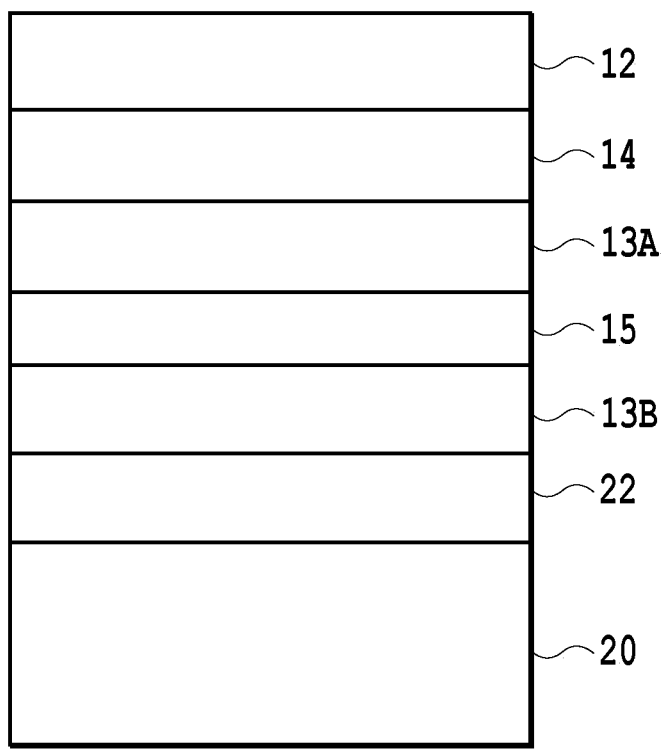
FIG. 21 is a view showing example 5 of a nitride semiconductor structure including a wurtzite-structure AlGaInBN thin film prepared by a preparation method of the present invention.

FIG. 21 shows example 5 of a nitride semiconductor structure including a wurtzite-structure AlGaInBN thin film prepared by a preparation method of the present invention. First, a (0001) sapphire substrate 11 was loaded into an MOCVD system, and thermal cleaning was performed in a hydrogen gas atmosphere at a reactor pressure of 300 Torr and a substrate temperature of 1080° C. Next, triethylboron and ammonia were fed to grow a (0001) h-BN thin film 12 at a substrate temperature of 1080° C. The film thickness of the h-BN thin film 12 was 3 nm. Next, trimethylaluminum, trimethylgallium, and ammonia were fed to grow a wurtzite-structure $Al_{0.2}Ga_{0.8}N$ thin film 14 on the h-BN thin film 12 at a substrate temperature of 1050° C. The film thickness of the wurtzite-structure $Al_{0.2}Ga_{0.8}N$ thin film 14 was 0.3 µm. In this way, a buffer layer including the h-BN thin film 12 and the AlGaN thin film 14 is grown on the sapphire substrate 11, and an InGaN/GaN quantum well structure is grown on the novel buffer layer. Trimethylgallium and ammonia were fed to grow a wurtzite-structure GaN thin film (corresponding to the "wurtzite-structure AlGaInBN thin film") 13A on the buffer layer at a substrate temperature of 1050° C. The film thickness of the wurtzite-structure GaN thin film 13A was 2.0 µm. Next, the substrate temperature was reduced to 730° C., and an InGaN/GaN multiple-quantum-well structure 15 was grown on the single-crystal wurtzite-structure GaN thin film 13A using trimethylindium, triethylgallium, and ammonia. The thickness of each InGaN well layer was 3 nm, and 10 quantum wells were grown. Then, the substrate temperature was increased to 1050° C. again, and a wurtzite-structure GaN thin film (corresponding to the "second wurtzite-structure AlGaInBN thin film") 13B was grown as a cap layer by feeding trimethylgallium and ammonia.

In the case where the thickness of the h-BN thin film 12 is equal to or more than that of a one-atom-thick layer, the InGaN/GaN multiple-quantum-well structure 15 can be grown on the buffer layer including the h-BN thin film 12 and the AlGaN thin film 14. Similarly, the InGaN/GaN multiple-quantum-well structure 15 can also be grown on a buffer layer constructed using a t-BN thin film instead of the h-BN thin film. In the case where the Al composition of the AlGaN thin film 14 included in the buffer layer is equal to or more than 10%, the InGaN/GaN multiple-quantum-well structure 15 can be grown on the buffer layer including the h-BN thin film 12 and the AlGaN thin film 14. Moreover, in the case where the film thickness of the AlGaN thin film 14 included in the buffer layer is equal to or more than 0.1 µm, the InGaN/GaN multiple-quantum-well structure 15 can be grown on the buffer layer including the h-BN thin film 12 and the AlGaN thin film 14. Further, the Al composition of the AlGaN thin film 14 included in the buffer layer may be graded from 10% to 0% in the direction from the h-BN thin film 12 to the single-crystal wurtzite-structure GaN thin film 13A to form a graded composition structure.

Next, the wurtzite-structure GaN thin film 13B as a cap layer was brought into contact with the surface of a 100-µm-thick indium metal sheet 22 formed on a receptor sapphire substrate 20 and heated to approximately 160° C. The indium melted, and the wurtzite-structure GaN thin film 13B and the indium metal sheet 22 firmly adhered to each other. Accordingly, the sapphire substrate 11 was able to be mechanically separated from the h-BN thin film 12, and the nitride semiconductor structure from the h-BN thin film 12 to the wurtzite-structure GaN thin film 13B as a cap layer was able to be transferred onto the indium metal sheet 22 on the sapphire substrate 14.

Figure 22:
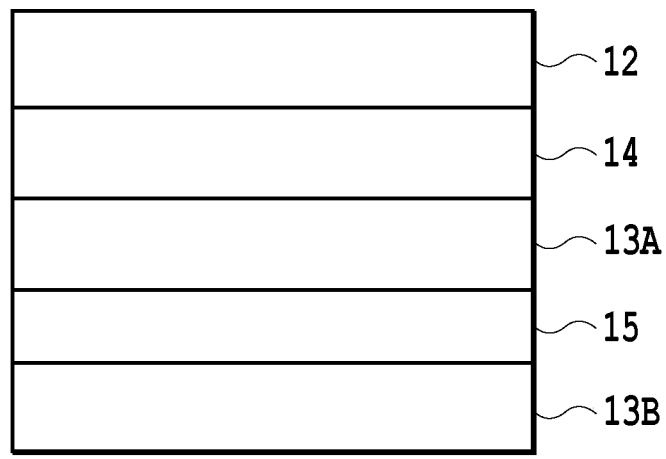
FIG. 22 is a view showing the nitride semiconductor structure of example 5.

Moreover, the nitride semiconductor structure of example 5 shown in FIG. 22 can also be removed by using tweezers or the like, not by transfer.

Figure 23:
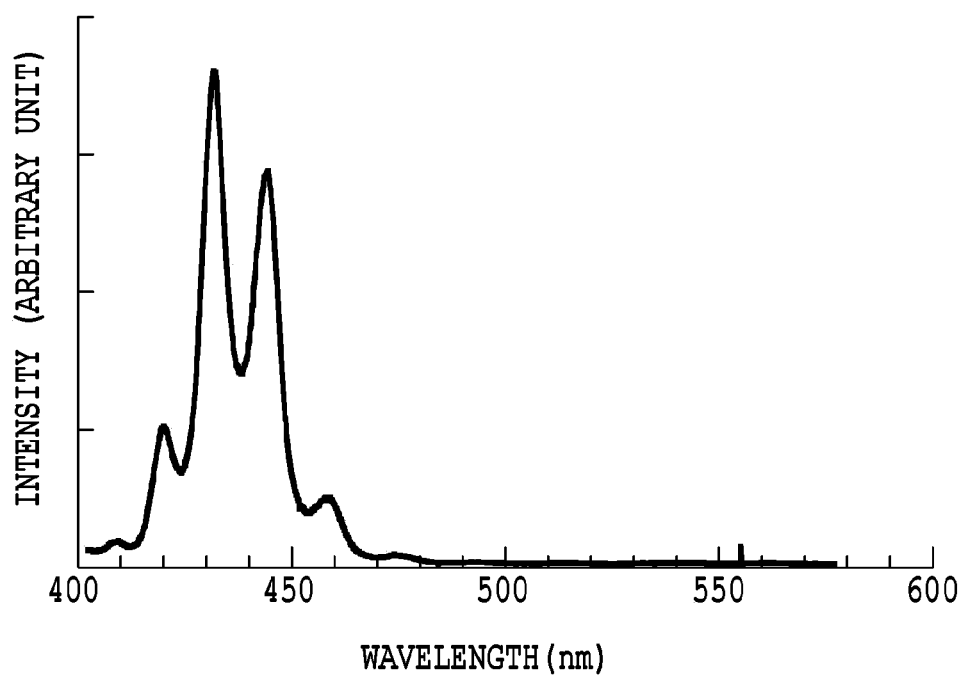
FIG. 23 is a view showing a photoluminescence spectrum of a transferred multiple-quantum-well structure of example 5.

FIG. 23 shows a photoluminescence spectrum of the transferred multiple-quantum-well structure. To excite only the InGaN/GaN multiple-quantum-well structure 15, an ultraviolet laser having an excitation wavelength of 375 nm was used. Temperature during measurement was room temperature, and excitation intensity was 500 µW. In conventional nitride semiconductor structures, as described in example 4, the InGaN/GaN multiple-quantum-well structure has been incapable of being separated from a sapphire substrate and transferred to a second substrate unless laser lift-off or chemical lift-off is performed. However, according to the present invention, the nitride semiconductor structure from the h-BN thin film 12 to the wurtzite-structure GaN thin film 13B as a cap layer was able to be mechanically separated from the sapphire substrate 11 and transferred onto the indium metal sheet 22. In the transferred InGaN/GaN multiple-quantum-well structure 15, luminescence from the InGaN/GaN multiple-quantum-well structure 15 was clearly observed at an (light) emission wavelength of 435 nm. Moreover, fringes caused by surface planarity were observed in the photoluminescence spectrum.

The above-described photoluminescence proved that the nitride semiconductor structure including the h-BN thin film 12, the single-crystal wurtzite-structure AlGaN thin film 14, the single-crystal wurtzite-structure GaN thin film 13A, the InGaN/GaN multiple-quantum-well structure 15, and the wurtzite-structure GaN thin film 13B as a cap layer, which have been grown on the sapphire substrate 11, is separated from the sapphire substrate 11 and transferred onto the indium metal sheet 22 on the sapphire substrate 20 with high-quality crystallinity maintained.

Example 6

Figure 24:
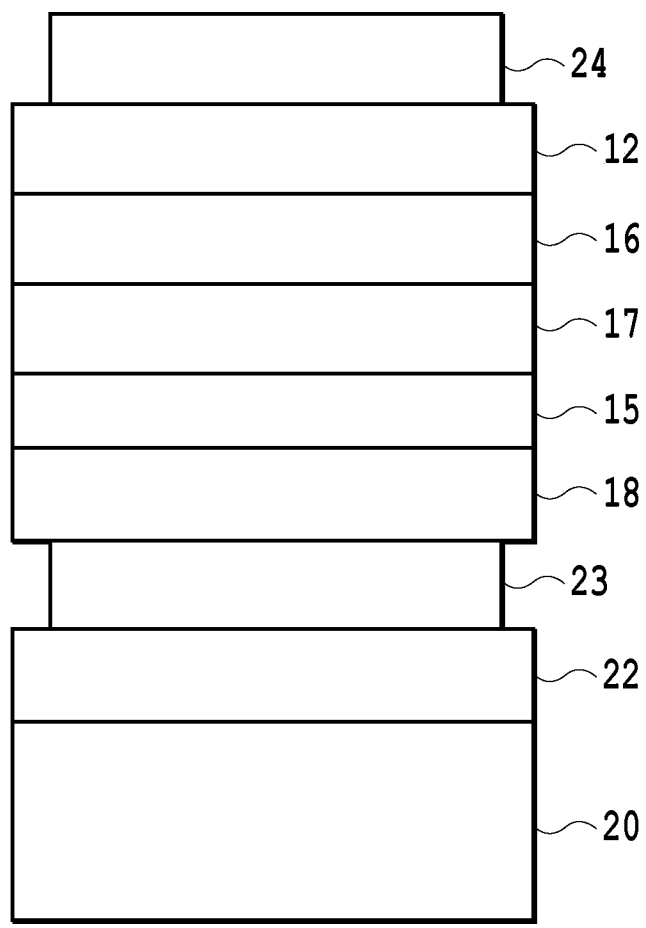
FIG. 24 is a view showing example 6 of a nitride semiconductor structure including a wurtzite-structure AlGaInBN thin film prepared by a preparation method of the present invention.

FIG. 24 shows example 6 of a nitride semiconductor structure including a wurtzite-structure AlGaInBN thin film prepared by a preparation method of the present invention. First, a (0001) sapphire substrate 11 was loaded into an MOCVD system, and thermal cleaning was performed in a hydrogen gas atmosphere at a reactor pressure of 300 Torr and a substrate temperature of 1080° C. Next, triethylboron and ammonia were fed to grow a (0001) h-BN thin film 12 at a substrate temperature of 1080° C. The film thickness of the h-BN thin film 12 was 3 nm. Next, trimethylaluminum, trimethylgallium, ammonia, and silane were fed to grow a Si-doped wurtzite-structure $Al_{0.2}Ga_{0.8}N$ thin film 16 as an n-type AlGaN thin film on the h-BN thin film 12 at a substrate temperature of 1050° C. The film thickness of the Si-doped wurtzite-structure AlGaN thin film 16 was 0.3 µm. In this way, a buffer layer including the h-BN thin film 12 and the Si-doped AlGaN thin film 16 is grown on the sapphire substrate 11, and an LED structure is grown thereon. Trimethylgallium, ammonia, and silane were fed to grow a Si-doped wurtzite-structure GaN thin film (corresponding to the "wurtzite-structure AlGaInBN thin film") 17 as an n-type GaN thin film 17 on the Si-doped wurtzite-structure AlGaN thin film 16 at a substrate temperature of 1050° C. The film thickness of the Si-doped wurtzite-structure GaN thin film 17 was 2.0 µm. Next, the substrate temperature was reduced to 730° C., and an InGaN/GaN multiple-quantum-well structure 15 was grown on the Si-doped wurtzite-structure GaN thin film 17 using triethylindium, triethylgallium, and ammonia. The thickness of each InGaN well layer was 3 nm, and 10 quantum wells were grown. Then, the substrate temperature was increased to 1050° C. again, a Mg-doped wurtzite-structure GaN thin film (corresponding to the "second wurtzite-structure AlGaInBN thin film") 18 was grown as a p-type GaN thin film at a substrate temperature of 1050° C. using trimethylgallium, ammonia, and cyclopentadienyl magnesium. Thus, an LED structure was prepared.

In the case where the thickness of the h-BN thin film 12 is equal to or more than that of a one-atom-thick layer, the above-described LED structure can be grown on the buffer layer including the h-BN thin film and the AlGaN thin film. Similarly, the above-described LED structure can also be grown on a buffer layer constructed using a t-BN thin film instead of the h-BN thin film. In the case where the Al composition of the Si-doped AlGaN thin film 20 is equal to or more than 10%, the above-described LED structure can be grown on the buffer layer including the h-BN thin film 12 and the Si-doped AlGaN thin film 16. Moreover, in the case where the film thickness of Si-doped AlGaN thin film 16 is equal to or more than 0.1 µm, the above-described LED structure can be grown. Further, the Al composition of the Si-doped AlGaN thin film 16 included in the buffer layer may be graded from 10% to 0% in the direction from the h-BN thin film 12 to the Si-doped wurtzite-structure GaN thin film 17 to form a graded composition structure.

A Hall effect measurement indicates that the Si-doped wurtzite-structure GaN thin film 17 is n-type and has a carrier concentration of $2 \times 10^{18}$ cm$^{-3}$ and a mobility of 160 cm$^2$/Vs, and that the Mg-doped wurtzite-structure GaN thin film 18 is p-type and has a carrier concentration of $1 \times 10^{17}$ cm$^{-3}$ and a mobility of 8 cm$^2$/Vs.

Next, a p-type electrode Ni/Au 23 was deposited on the Mg-doped wurtzite-structure GaN thin film 18 of the above-described LED structure using an electron beam deposition system. Subsequently, the p-type electrode Ni/Au 23 of the above-described LED structure was brought into contact with the surface of a 100-µm-thick indium metal sheet 22 formed on a sapphire substrate 20 and heated to approximately 160° C. The indium melted, and the p-type electrode Ni/Au 23 and the indium metal sheet 22 firmly adhered to each other. Accordingly, the sapphire substrate 11 was able to be mechanically separated from the h-BN thin film 12, and the above-described LED structure was able to be transferred onto the indium metal sheet 22. Finally, an n-type electrode Ti/Au 24 was deposited on the h-BN thin film 12 of the above-described LED structure using an electron beam deposition system.

Figure 26:
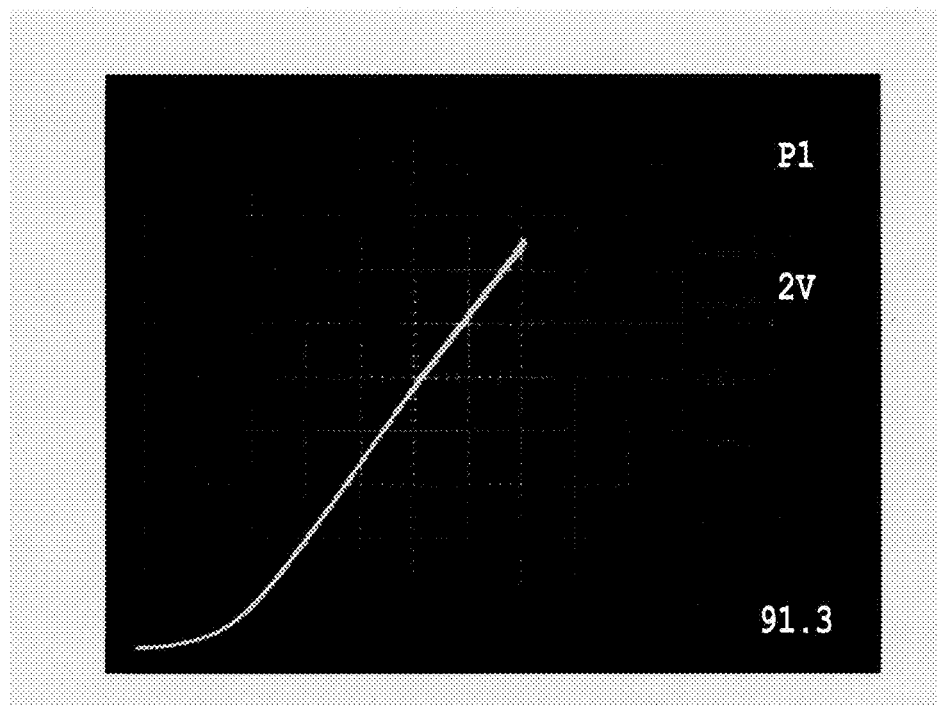
FIG. 26 is a view showing the forward current-voltage characteristic of the transferred LED structure of example 6.

FIG. 26 shows the forward current-voltage characteristic of the above-described LED structure transferred. The forward current-voltage characteristic rises at approximately 3.5 V, and indicates clear rectifying characteristics. Thus, it was confirmed that a good diode structure was formed. Moreover, the emission of violet light was visually observed. From an electroluminescence spectrum of the transferred LED of the present invention, a clear, violet electroluminescence spectrum having a peak at a wavelength of 430 nm was obtained.

Figure 25:
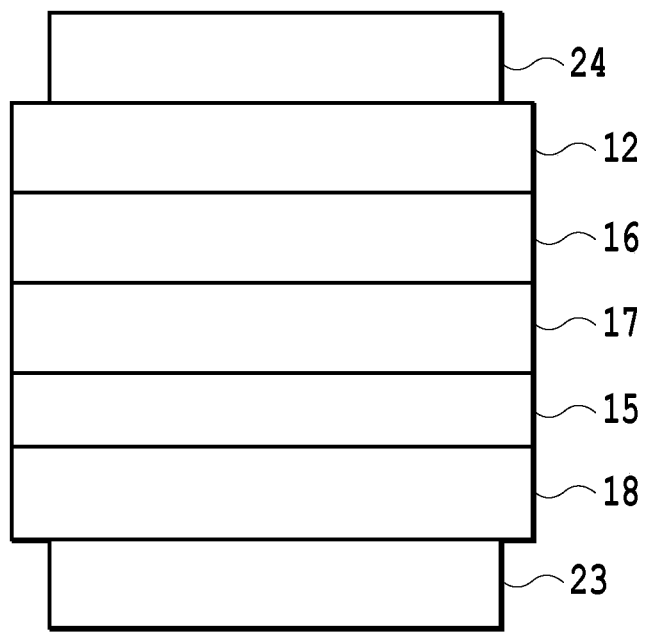
FIG. 25 is a view showing the nitride semiconductor structure of example 6.

Additional information on the indium metal sheet 22 as a bonding layer will be provided. In the case of a vertical device through which a current is caused to flow from the topmost layer 24 to the undermost layer 23 in the top-to-bottom direction, such as the LED structure shown in FIG. 25, a power supply needs to be connected to the n-type electrode Ti/Au 24 and the p-type electrode Ni/Au 23 to apply a voltage. In this case, the indium metal sheet 22 is required not only to play a role in bonding to the receptor sapphire substrate 20 but also to serve as a conduction layer through which a current flows. Accordingly, in the case where the bonding layer 22 is made of metal or conductive adhesive tape or conductive adhesive, a current can be caused to flow in the vertical direction through the substrate 20 or through metal deposited on the substrate 20, and the nitride semiconductor structure can be operated as a vertical device, for example, as an LED or as an LD.

Example 7

Figure 27:
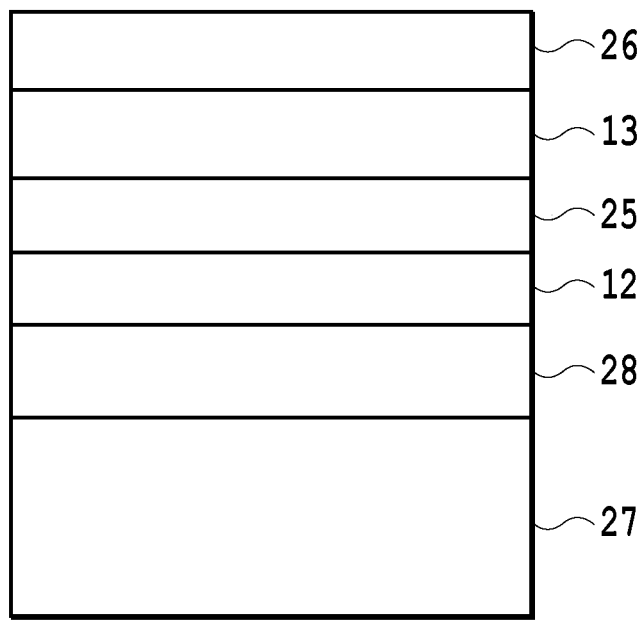
FIG. 27 is a view showing example 7 of a nitride semiconductor structure including a wurtzite-structure AlGaInBN thin film prepared by a preparation method of the present invention.

FIG. 27 shows example 4 of a nitride semiconductor structure including a wurtzite-structure AlGaInBN thin film prepared by a preparation method of the present invention. First, a (0001) sapphire substrate 11 was loaded into an MOCVD system, and thermal cleaning was performed in a hydrogen gas atmosphere at a reactor pressure of 300 Torr and a substrate temperature of 1080° C. Next, triethylboron and ammonia were fed to grow a (0001) h-BN thin film 12 at a substrate temperature of 1080° C. The film thickness of the h-BN thin film 12 was 3 nm. Next, trimethylaluminum and ammonia were fed to grow a wurtzite-structure AlN thin film 25 on the h-BN thin film 12 at a substrate temperature of 1050° C. The film thickness of the wurtzite-structure AlN thin film 25 was 0.1 μm. In this way, a buffer layer including the h-BN thin film 12 and the wurtzite-structure AlN thin film 25 is grown on the sapphire substrate 11, and an AlGaN/GaN HEMT structure is grown thereon. Trimethylgallium and ammonia were fed to grow a GaN thin film (corresponding to the "wurtzite-structure AlGaInBN thin film") 13 on the wurtzite-structure AlN thin film 25 at a substrate temperature of 1050° C. The film thickness of the GaN thin film 13 was 2.0 μm. Finally, trimethylaluminum, trimethylgallium, and ammonia were fed to grow a wurtzite-structure $Al_{0.2}Ga_{0.8}N$ thin film (corresponding to the "second wurtzite-structure AlGaInBN thin film") 26 having a film thickness of 20 nm at a substrate temperature of 1050° C. Thus, an AlGaN/GaN HEMT structure was prepared.

In the case where the thickness of the h-BN thin film 12 is equal to or more than that of a one-atom-thick layer, the above-described AlGaN/GaN HEMT structure can be grown on the buffer layer including the h-BN thin film 12 and the AlN thin film 25. Similarly, the above-described AlGaN/GaN HEMT structure can also be grown on a buffer layer constructed using a t-BN thin film instead of the h-BN thin film. Moreover, in the case where the film thickness of the AlN thin film 25 is equal to or more than 0.1 μm, the above-described AlGaN/GaN HEMT structure can be grown.

A Hall effect measurement proved that the above-described AlGaN/GaN HEMT structure exhibits a two-dimensional electron gas density of $1.5 \times 10^{13}$ $cm^{-2}$, and that a good two-dimensional electron gas is formed at the interface between the wurtzite-structure AlGaN thin film 26 and the GaN thin film 13.

Figure 28:
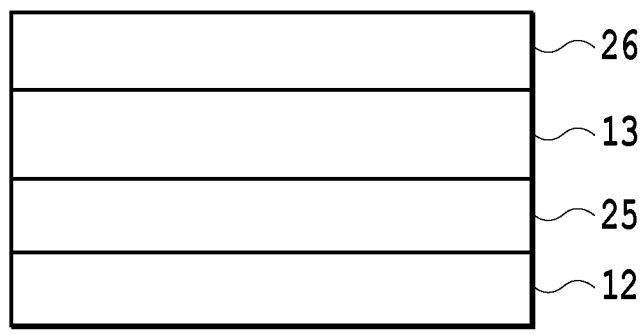
FIG. 28 is a view showing the nitride semiconductor structure of example 7.

Next, the AlGaN/GaN HEMT structure including the h-BN thin film 12, the AlN thin film 25, the GaN thin film 13, and the AlGaN thin film 26 was mechanically separated from the sapphire substrate 11 by picking up the sapphire substrate with tweezers. FIG. 28 shows the AlGaN/GaN HEMT structure separated from the sapphire substrate. The separated AlGaN/GaN HEMT structure was able to be transferred by being attached to double-sided adhesive tape 28 on a polycrystalline copper substrate 27.

By forming electrodes on the transferred AlGaN/GaN HEMT structure using Ti/Au for drain and source electrodes and Ni/Au for a gate electrode and evaluating drain current-voltage characteristics of the prepared AlGaN/GaN HEMT structure with respect to gate voltages, good pinch-off characteristics can be obtained.

Example 8

Figure 29:
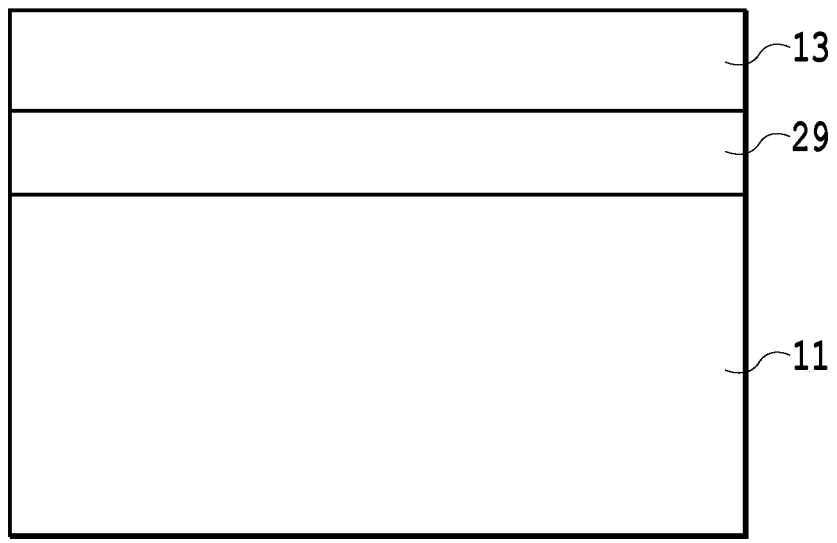
FIG. 29 is a view showing a nitride semiconductor structure on a sapphire substrate prepared according to a conventional technique (Non-Patent Literature 6).

FIG. 29 shows a conventional nitride semiconductor structure obtained by growing a ZnO sacrificial layer on a sapphire substrate and growing a wurtzite AlGaInBN thin film on the sacrificial layer. First, a (0001) sapphire substrate 11 is loaded into a PLD system to grow a ZnO sacrificial layer 29. The film thickness of the ZnO sacrificial layer 29 is 200 nm. Next, the sapphire substrate 11 having the ZnO sacrificial layer 29 grown thereon was taken out of the PLD system and loaded into an MOCVD system. Then, in a nitrogen gas atmosphere, trimethylgallium and ammonia were fed to grow a wurtzite GaN thin film 13. The film thickness of the wurtzite GaN thin film 13 is 150 nm. It has been reported that a planar, single-crystal wurtzite GaN thin film 13 can be obtained by this method.

Figure 30:
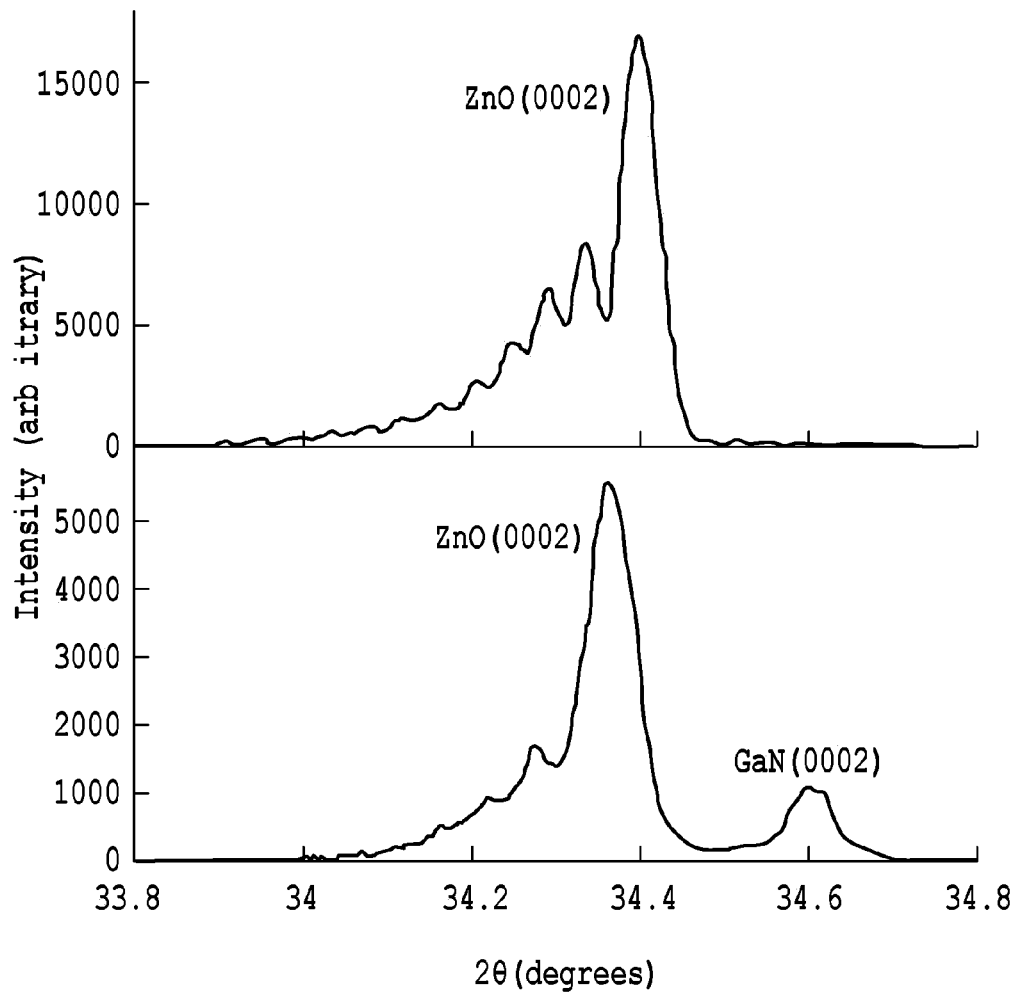
FIG. 30 shows the 2θ/ω X-ray diffraction of a nitride semiconductor structure on the sapphire substrate prepared according to the conventional technique (Non-Patent Literature 6).

FIG. 30 shows the 2θ/ω X-ray diffraction of the nitride semiconductor structure prepared by a conventional technique shown in FIG. 29. With regard to a sample having the ZnO sacrificial layer 29 grown on the sapphire substrate 11 by PLD, as shown in an upper part of FIG. 30, diffraction from (0002) ZnO is observed. With regard to a sample having the wurtzite GaN thin film 13 grown on the ZnO sacrificial layer 29 on the sapphire substrate 11, as show in a lower part of FIG. 30, diffraction from (0002) ZnO and diffraction from (0002) GaN are observed. This indicates that the single-crystal GaN thin film 13 has been grown on the ZnO sacrificial layer 29 on the sapphire substrate 11.

However, this method requires a PLD system for the growth of the ZnO sacrificial layer 29 and also requires the optimization of the ZnO sacrificial layer 29. Further, to separate the single-crystal wurtzite GaN thin film 13 from the sapphire substrate 11 after the growth of the single-crystal wurtzite GaN thin film 13, this method requires a process for chemically etching the ZnO sacrificial layer by immersing the sample in diluted hydrogen chloride.

Figure 31:
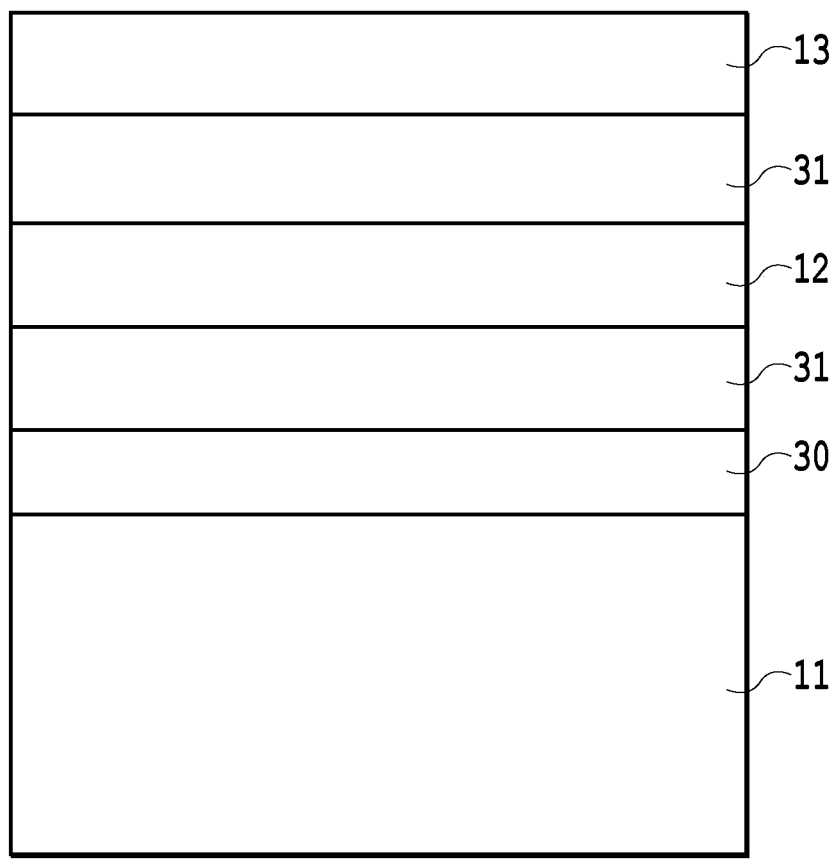
FIG. 31 shows a nitride semiconductor structure on a sapphire substrate of the present invention

FIG. 31 shows example 8 of a nitride semiconductor structure of the present invention. All of the following layers are grown using an MOCVD system. First, a (0001) sapphire substrate 11 was loaded into the MOCVD system, and thermal cleaning was performed in a hydrogen gas atmosphere at a reactor pressure of 300 Torr and a substrate temperature of 1080° C. Next, trimethylaluminum and ammonia were fed to grow an AlN buffer layer 30 at a substrate temperature of 550° C. The film thickness of AlN buffer layer 30 was 20 nm. After that, while ammonia was being fed, the substrate temperature was increased to 1080° C., and the AlN buffer layer 30 was annealed. Then, at a substrate temperature of 1080° C., trimethylaluminum and ammonia were fed to grow a wurtzite AlN thin film 31. The film thickness of the wurtzite AlN thin film 31 was 100 nm. In this process, a method is used in which a high-quality AlN thin film is grown using a low-temperature AlN buffer layer on a sapphire substrate.

On this planar wurtzite AlN thin film 31, an h-BN thin film 12 as a release layer is grown. Triethylboron and ammonia were fed to grow the h-BN thin film 12 on the wurtzite AlN thin film 31 at a substrate temperature of 1080° C. The film thickness of the h-BN thin film 12 is 2 nm. A wurtzite AlN thin film 31 was grown on the h-BN thin film 12 at a substrate temperature of 1080° C. using trimethylaluminum, trimethylgallium, and ammonia. Further, a wurtzite GaN thin film 13 was grown on the wurtzite AlN thin film 31. The film thickness of the wurtzite AlN thin film 31 is 100 nm, and the film thickness of the wurtzite GaN thin film 13 is 3.0 μm. In FIG. 31, the wurtzite AlN thin film 31, the h-BN thin film 12, and the wurtzite AlN thin film 31 form a double heterostructure.

Figure 32:
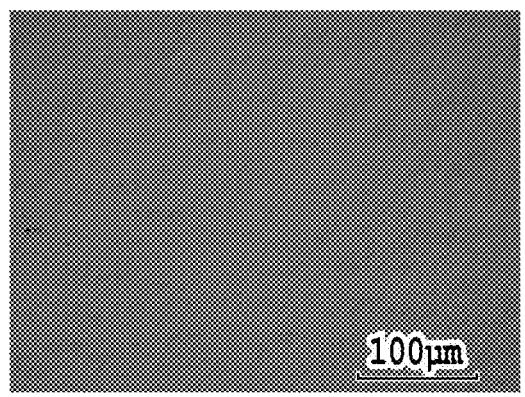
FIG. 32 is a photograph of the surface of a wurtzite GaN thin film 13 shown in FIG. 31.

FIG. 32 is a photograph of the surface of the wurtzite GaN thin film 13 shown in FIG. 31. The wurtzite GaN thin film 13 has a very planar surface.

Figure 33:
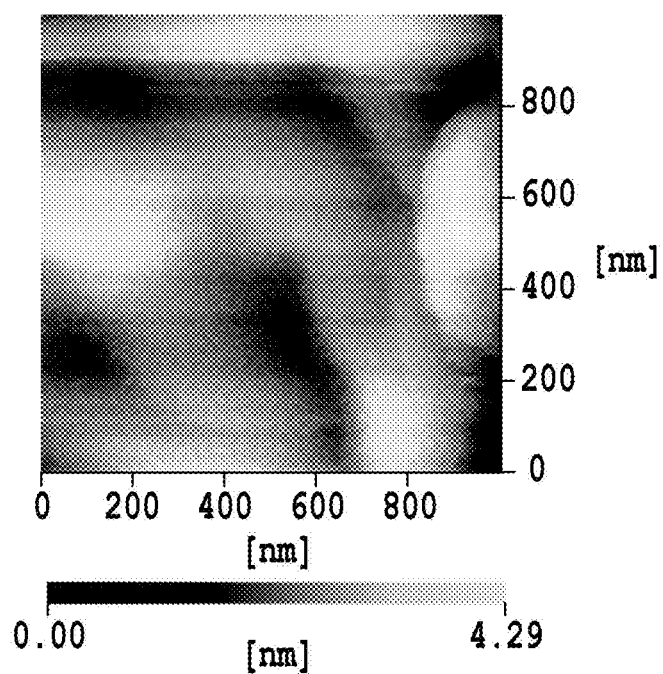
FIG. 33 is an atomic force microscopy image of the wurtzite GaN thin film 13 shown in FIGS. 31.

FIG. 33 is an atomic force microscopy (AFM) image of the wurtzite GaN thin film 13 shown in FIG. 31. The observation area is 1 $μm^2$. The root mean square roughness of the wurtzite GaN thin film 13 in the AFM image is 0.7 nm, and, together with the surface photograph of FIG. 28, indicates that a planar, single-crystal wurtzite GaN thin film 13 was able to be grown on the double heterostructure including the wurtzite AlN thin film 31, the h-BN thin film 12, and the wurtzite AlN thin film 31. Unlike a ZnO or CrN sacrificial layer, the h-BN thin film 12 is grown using an MOCVD system, and this shows that other equipment than the MOCVD system is not required.

Figure 34:
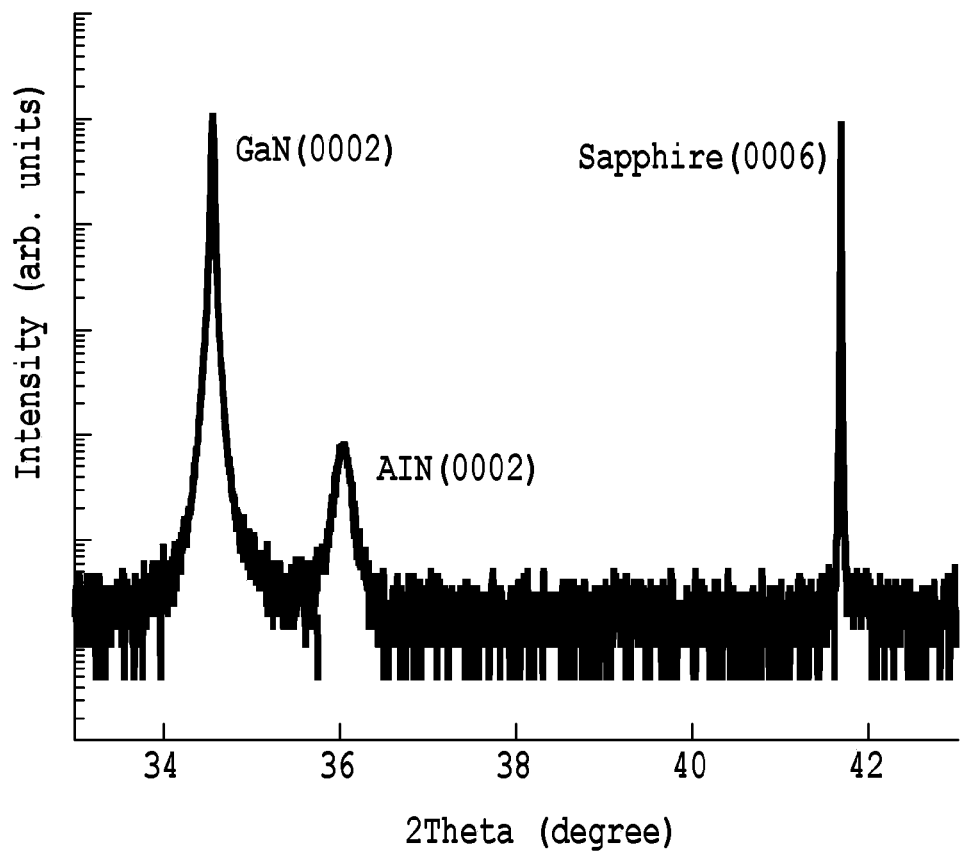
FIG. 34 shows the 2θ/ω X-ray diffraction of the wurtzite GaN thin film 13, a wurtzite AlN thin film 31, and the sapphire substrate 11 shown in FIG. 31.

FIG. 34 shows the 2θ/ω X-ray diffraction of the wurtzite GaN thin film 13 shown in FIG. 31. Diffraction from (0002) of the wurtzite GaN thin film 13 and diffraction from (0002) of the wurtzite AlN thin film 31 were clearly observed. Since the film thickness of the h-BN thin film 12 is as small as 2 nm, the h-BN thin film 12 cannot be observed by X-ray diffraction. The c-axis lattice constant of the single-crystal wurtzite GaN thin film 13 is 5.188 Å, and the single-crystal wurtzite GaN thin film 13 is under compressive strain along the c axis. This indicates that the single-crystal wurtzite GaN thin film 13 was able to be grown on the double heterostructure including the wurtzite AlN thin film 31, the h-BN thin film 12, and the wurtzite AlN thin film 31 on the sapphire substrate 11.

Figure 35A:
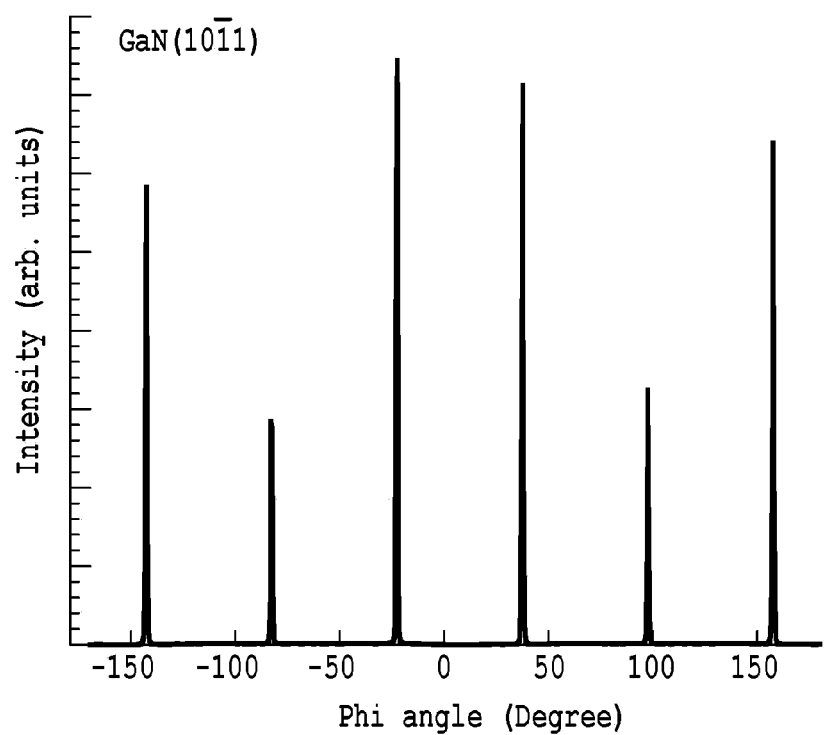
FIG. 35A shows the X-ray diffraction (phi scan) of the wurtzite GaN thin film 13 shown in FIG. 31.
Figure 35B:
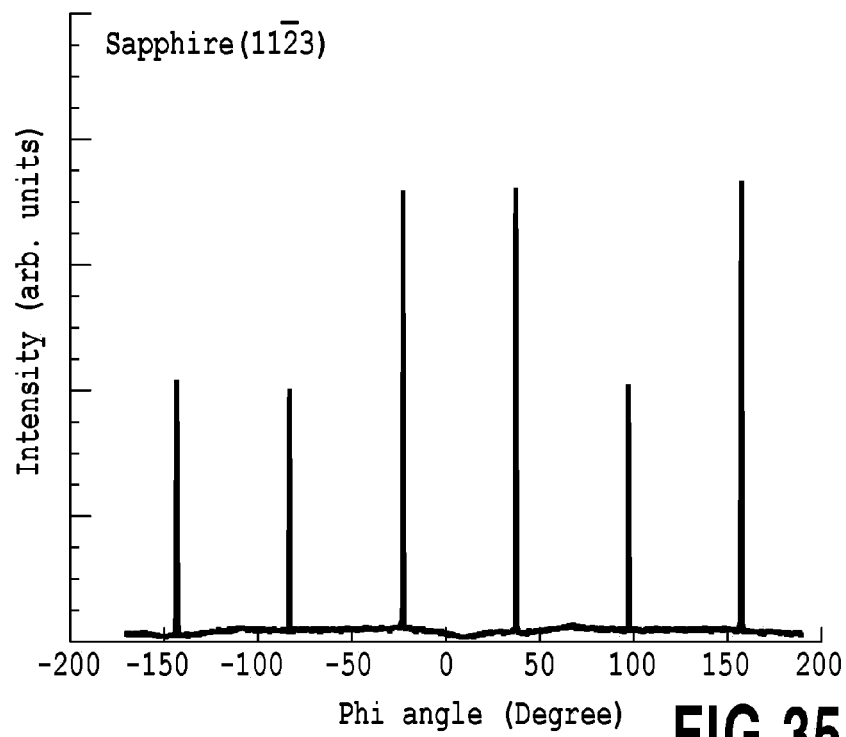
FIG. 35B shows the X-ray diffraction (phi scan) of the sapphire substrate 11 shown in FIG. 31.

FIGS. 35A and 35B show the X-ray diffraction (phi scans) of the wurtzite GaN thin film 13 and the sapphire substrate 11 shown in FIG. 31, respectively. Six clear GaN (10-11) diffraction peaks (in the present description, the symbol "1" with an overline as shown in the drawing is represented by "−1") are observed. This indicates that the single-crystal wurtzite GaN thin film 13 was able to be grown. From this X-ray diffraction (phi scans), it can be seen that the in-plane orientational relationship among the sapphire substrate 11, the wurtzite AlN thin film 31, and the wurtzite GaN thin film 13 is sapphire [2-1-10] ∥ AlN [10-10] ∥ GaN [10-10].

The above-described surface observation, atomic force microscopy image, 2θ/ω X-ray diffraction, and X-ray diffraction (phi scans) have revealed that though a PLD system or a sputtering system has heretofore been required to grow a ZnO layer or a CrN layer as a sacrificial layer, and the time to optimize a ZnO or CrN sacrificial layer has been required, the present invention makes it possible to grow the single-crystal wurtzite GaN thin film 13 on the double heterostructure including the wurtzite AlN thin film 31, the h-BN thin film 12, and the wurtzite AlN thin film 31 on the sapphire substrate 11 using only an MOCVD system. Since the h-BN layer 12 in the double heterostructure serves as a release layer, the single-crystal wurtzite GaN thin film 13 can be mechanically separated from the sapphire substrate. Accordingly, an etchant and an etching process are not required.

Here, with regard to the double heterostructure including the wurtzite AlN thin film 31, the h-BN thin film 12, and the wurtzite AlN thin film 31, results will be described. In the case where the thickness of the h-BN thin film 12 is equal to or more than that of a one-atom-thick layer, the h-BN thin film 12 serves as a release layer, and the single-crystal wurtzite GaN thin film 13 can be mechanically separated from the sapphire substrate 11. Similarly, using a t-BN thin film instead of the h-BN thin film 12, also, the t-BN thin film serves as a release layer, and the single-crystal wurtzite GaN thin film 13 can be mechanically separated from the sapphire substrate 11. In the case where a buffer layer is constructed using a wurtzite GaN thin film or a wurtzite AlGaN thin film instead of the wurtzite AlN included in the buffer layer, and where a wurtzite-structure $Al_xGa_{1-x}N$ containing not less than 10% Al is used instead of the wurtzite AlN thin film 31 included in the double heterostructure to form a double heterostructure, also, a planar, single-crystal wurtzite GaN thin film 13 can be grown on this double heterostructure.

Example 9

Figure 36:
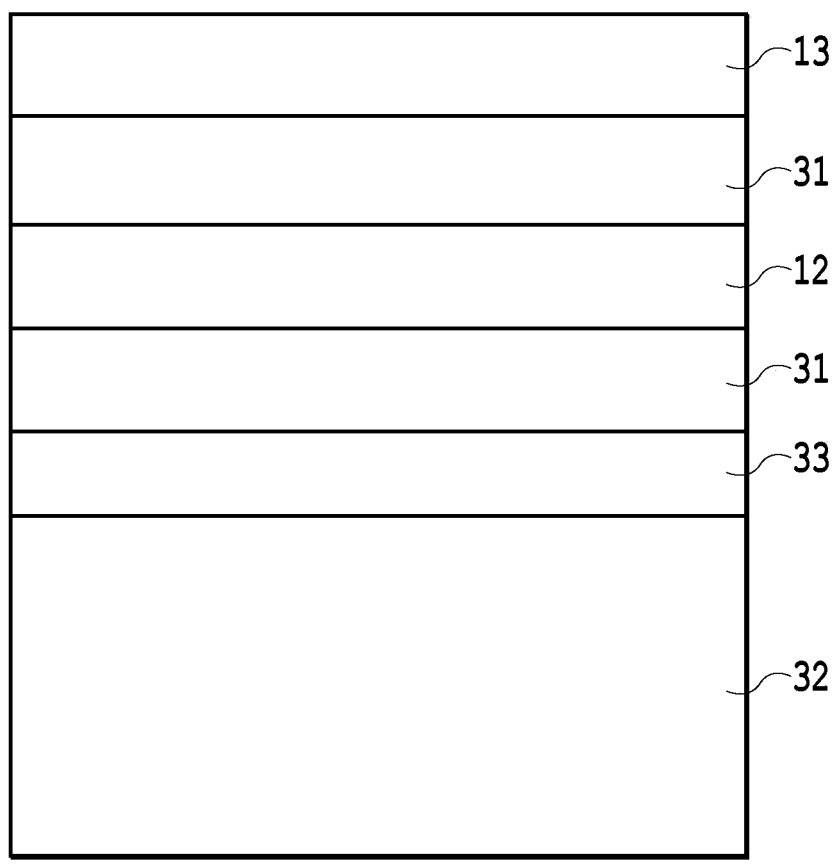
FIG. 36 shows a nitride semiconductor structure on a (111) Si substrate of the present invention.

FIG. 36 shows example 9 of a nitride semiconductor structure of the present invention. All of the following layers are grown using an MOCVD system. First, a (111) Si substrate 32 was loaded into the MOCVD system, and thermal cleaning was performed in a hydrogen gas atmosphere at a reactor pressure of 300 Torr and a substrate temperature of 1080° C. Next, only trimethylaluminum was fed to grow an Al layer for inhibiting the reaction with the Si substrate at a substrate temperature of 1080° C. After that, trimethylaluminum and ammonia were fed to grow a wurtzite AlN buffer layer 33. The film thickness of the wurtzite AlN buffer layer 33 was 100 nm. Trimethylaluminum and ammonia were fed to grow a wurtzite AlN thin film 31 on the wurtzite AlN buffer layer 33. In this process, a method is used in which a high-quality AlN thin film is grown using a wurtzite AlN buffer layer on a (111) Si substrate.

On this planar wurtzite AlN thin film 31, an h-BN thin film 12 as a release layer is grown. Triethylboron and ammonia were fed to grow an h-BN thin film 12 on the wurtzite AlN thin film 31 at a substrate temperature of 1080° C. The film thickness of the h-BN thin film 12 is 2 nm. A wurtzite AlN thin film 31 was grown on the h-BN thin film 12 at a substrate temperature of 1080° C. using trimethylaluminum, trimethylgallium, and ammonia. Further, a wurtzite GaN thin film 13 was grown on the wurtzite AlN thin film 31. The film thickness of the wurtzite AlN thin film 31 is 100 nm, the film thickness of the wurtzite GaN thin film 13 is 3.0 μm. In FIG. 36, the wurtzite AlN thin film 31, the h-BN thin film 12, and the wurtzite AlN thin film 31 form a double heterostructure.

Figure 37:
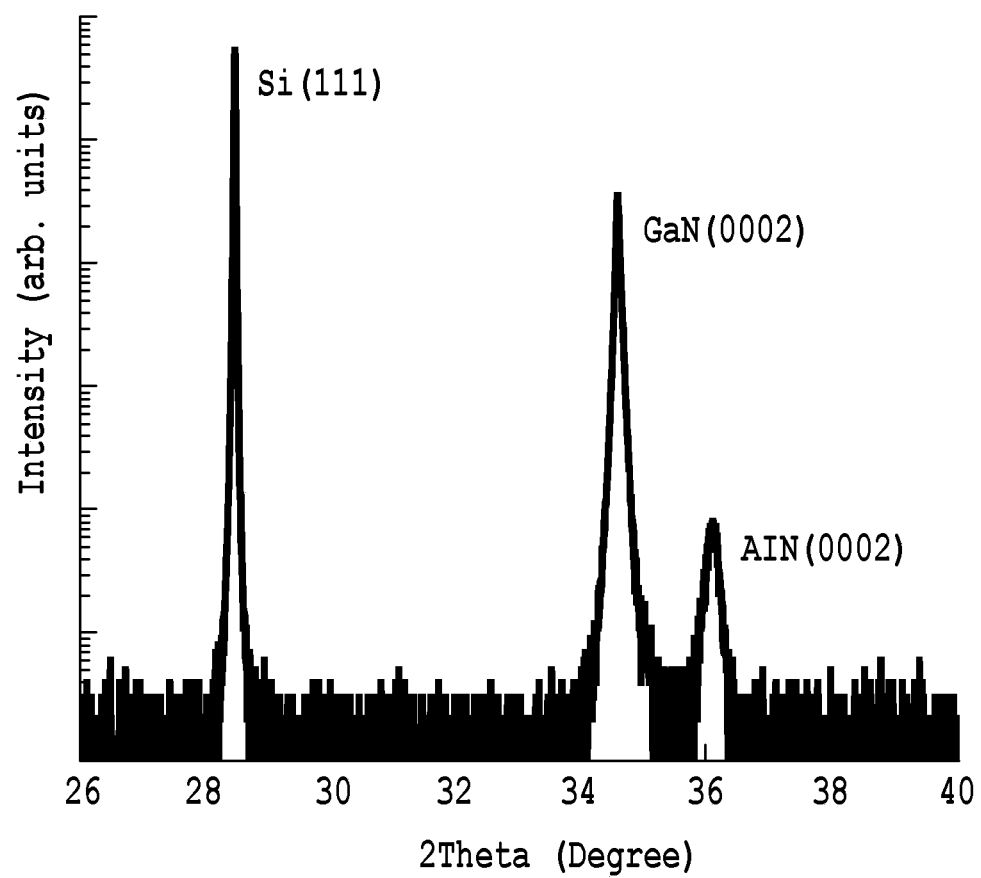
FIG. 37 shows the 2θ/ω X-ray diffraction of a wurtzite GaN thin film 13, a wurtzite AlN buffer layer 31, and the (111) Si substrate 32 shown in FIG. 36.

FIG. 37 shows the 2θ/ω X-ray diffraction of the wurtzite GaN thin film 13 shown in FIG. 36. Diffraction from (0002) of the wurtzite GaN thin film 13 and diffraction from (0002) of the wurtzite AlN thin film 31 were clearly observed. Since the film thickness of the h-BN thin film 12 is as small as 2 nm, the h-BN thin film 12 cannot be observed by X-ray diffraction. The c-axis lattice constant of the single-crystal wurtzite GaN thin film 13 is 5.185 Å, and the single-crystal wurtzite GaN thin film 13 is under tensile strain along the c axis. This indicates that the single-crystal wurtzite GaN thin film 13 was able to be grown on the double heterostructure including the wurtzite AlN thin film 31, the h-BN thin film 12, and the wurtzite AlN thin film 31 on the (111) Si substrate 32.

Figure 38A:
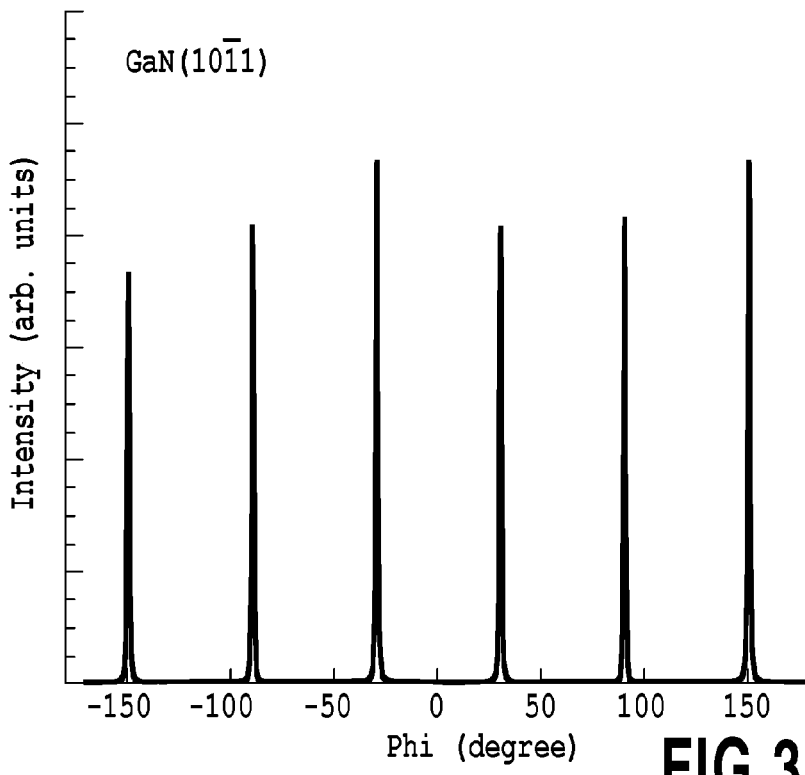
FIG. 38A shows the X-ray diffraction (phi scan) of the wurtzite GaN thin film 13 shown in FIG. 36.
Figure 38B:
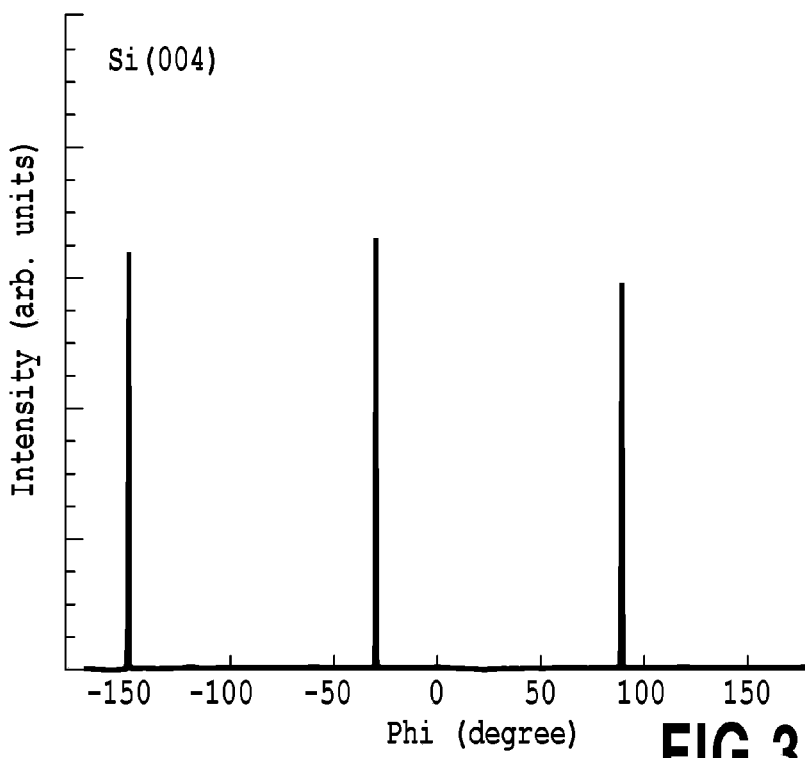
FIG. 38B shows the X-ray diffraction (phi scan) of the (111) Si substrate 32 shown in FIG. 36.

FIGS. 38A and 38B show the X-ray diffraction (phi scans) of the wurtzite GaN thin film 13 and the (111) Si substrate 32 shown in FIG. 36, respectively. Six clear GaN (10-11) diffraction peaks are observed. This indicates that the single-crystal wurtzite GaN thin film 13 was able to be grown. From this X-ray diffraction (phi scans), it can be seen that the in-plane orientational relationship among the (111) Si substrate 32, the wurtzite AlN thin film 31, and the wurtzite GaN thin film 13 is Si [−1-12] ∥ AlN [10-10] ∥ GaN [10-10].

The above-described 2θ/ω X-ray diffraction and X-ray diffraction (phi scans) have revealed that though a SIMOX system has heretofore been required to grow a $SiO_2$ layer as a sacrificial layer or a SOI substrate constructed using a Si substrate, the present invention makes it possible to grow the single-crystal wurtzite GaN thin film 13 on the double heterostructure including the wurtzite AlN thin film 31, the h-BN thin film 12, and the wurtzite AlN thin film 31 on the (111) Si substrate 32 using only an MOCVD system. Since the h-BN layer 12 in the double heterostructure serves as a release layer, the single-crystal wurtzite GaN thin film 13 can be mechanically separated from the (111) Si substrate. Accordingly, mechanical polishing, an etchant, and an etching process are not required.

Here, with regard to the double heterostructure including the wurtzite AlN thin film 31, the h-BN thin film 12, and the wurtzite AlN thin film 31, results will be described. In the case where the thickness of the h-BN thin film 12 is equal to or more than that of a one-atom-thick layer, the h-BN thin film 12 serves as a release layer, and the single-crystal wurtzite GaN thin film 13 can be mechanically separated from the Si substrate 32. Moreover, in the case where a t-BN thin film is used instead of the h-BN thin film 12, the t-BN thin film serves as a release layer, and the single-crystal wurtzite GaN thin film 13 can be mechanically separated from the Si substrate 32. In the case where a wurtzite-structure $Al_xGa_{1-x}N$ containing not less than 10% Al is used instead of the wurtzite AlN thin film 31 included in the double heterostructure to form a double heterostructure, also, a planar, single-crystal wurtzite GaN thin film 13 can be grown on this double heterostructure.

Example 10

Figure 39:
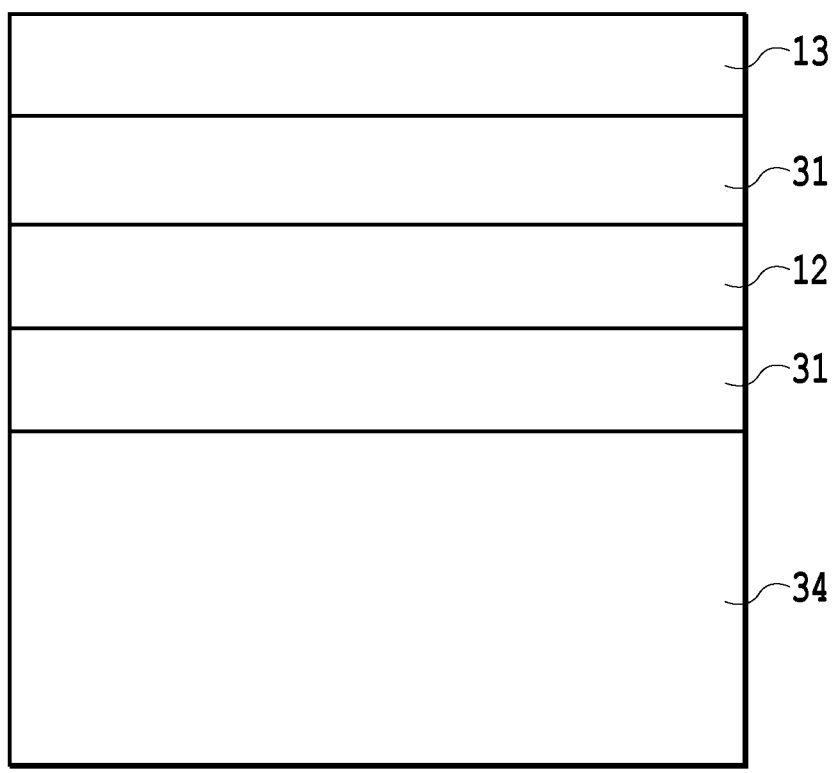
FIG. 39 shows a nitride semiconductor structure on a 6H-SiC substrate of the present invention.

FIG. 39 shows example 10 of a nitride semiconductor structure of the present invention. All of the following layers are grown using an MOCVD system. First, a (0001) 6H-SiC substrate 34 was loaded into the MOCVD system, and thermal cleaning was performed in a hydrogen gas atmosphere at a reactor pressure of 300 Torr and a substrate temperature of 1080° C. Next, trimethylaluminum and ammonia were fed to grow a wurtzite AlN thin film 31.

On this planar wurtzite AlN thin film 31, an h-BN thin film 12 as a release layer is grown. Triethylboron and ammonia were fed to grow an h-BN thin film 12 on the wurtzite AlN thin film 31 at a substrate temperature of 1080° C. The film thickness of the h-BN thin film 12 is 2 nm. A wurtzite AlN thin film 31 was grown on the h-BN thin film 12 at a substrate temperature of 1080° C. using trimethylaluminum, trimethylgallium, and ammonia. Further, a wurtzite GaN thin film 13 was grown on the wurtzite AlN thin film 31. The film thickness of the wurtzite AlN thin film 31 is 100 nm, and the film thickness of the wurtzite GaN thin film 13 is 3.0 μm. In FIG. 36, the wurtzite AlN thin film 31, the h-BN thin film 12, and the wurtzite AlN thin film 31 form a double heterostructure.

Figure 40:
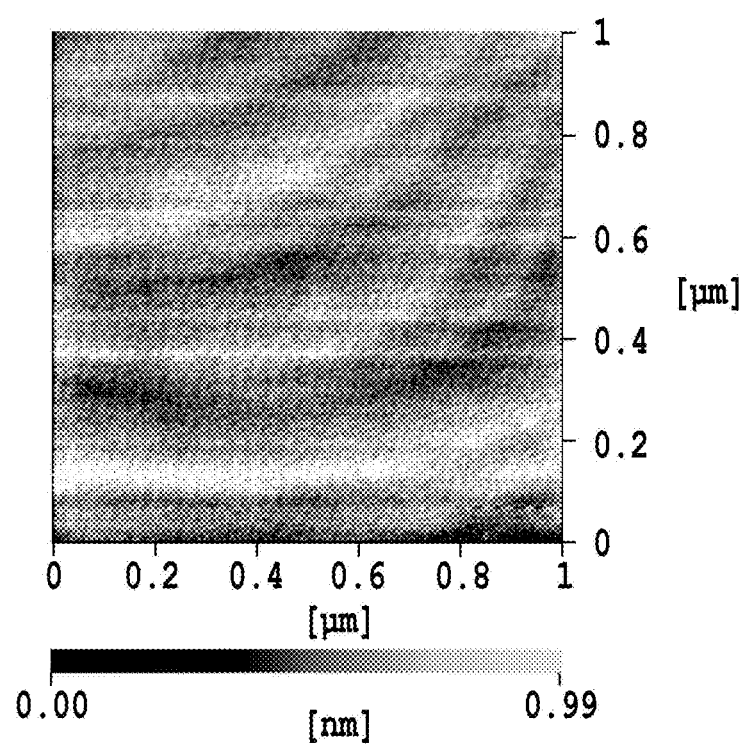
FIG. 40 is an atomic force microscopy image of a wurtzite GaN thin film 13 shown in FIG. 39.

FIG. 40 is an atomic force microscopy (AFM) image of the wurtzite GaN thin film 13 shown in FIG. 39. The observation area is 1 μm². The root mean square roughness of the wurtzite GaN thin film 13 in the AFM image is 0.2 nm. This indicates that the planar, single-crystal wurtzite GaN thin film 13 was able to be grown on the double heterostructure including the wurtzite AlN thin film 31, the h-BN thin film 12, and the wurtzite AlN thin film 31. The h-BN thin film 12 can be grown using an MOCVD system, and this shows that other growth equipment than the MOCVD system is not required.

Figure 41:
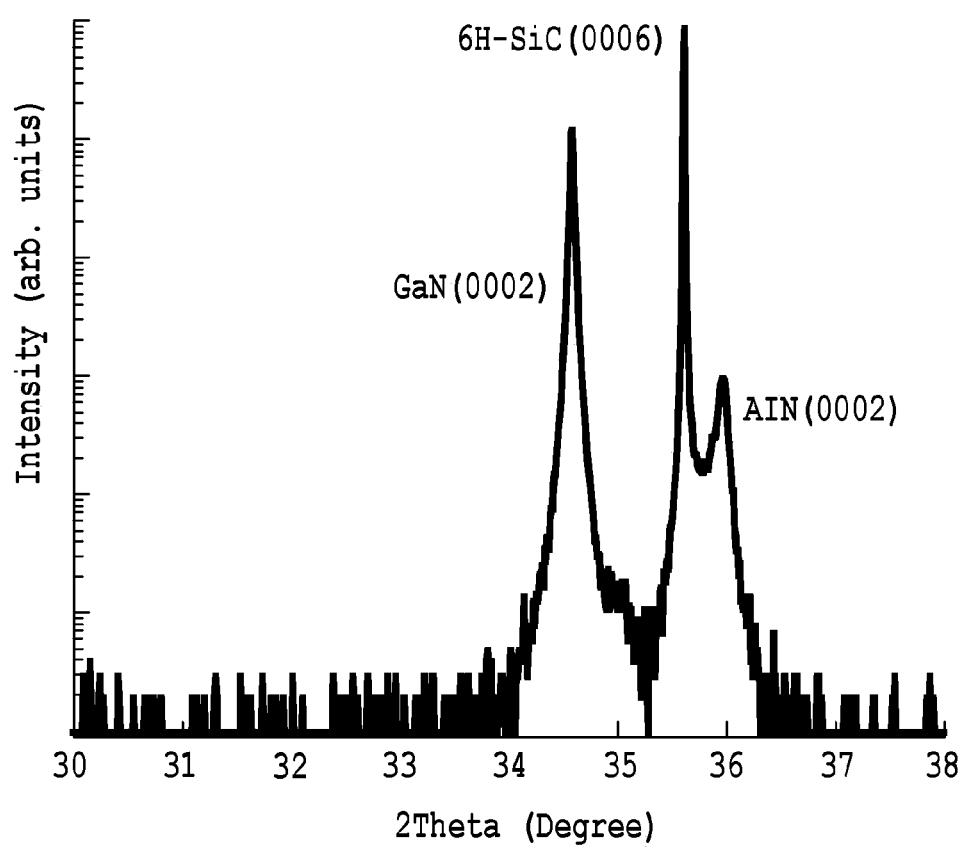
FIG. 41 shows the 2θ/ω X-ray diffraction of the wurtzite GaN thin film 13, a wurtzite AlN thin film 31, and the 6H-SiC substrate 34 shown in FIG. 39.

FIG. 41 shows the 2θ/ω X-ray diffraction of the wurtzite GaN thin film 13 shown in FIG. 39. Diffraction from (0002) of the wurtzite GaN thin film 13 and diffraction from (0002) of the wurtzite AlN thin film 31 were clearly observed. Since the film thickness of the h-BN thin film 12 is as small as 2 nm, the h-BN thin film 12 cannot be observed by X-ray diffraction. This indicates that the single-crystal wurtzite GaN thin film 13 was able to be grown on the double heterostructure including the wurtzite AlN thin film 31, the h-BN thin film 12, and the wurtzite AlN thin film 31 on the (0001) 6H-SiC substrate 34.

Figure 42A:
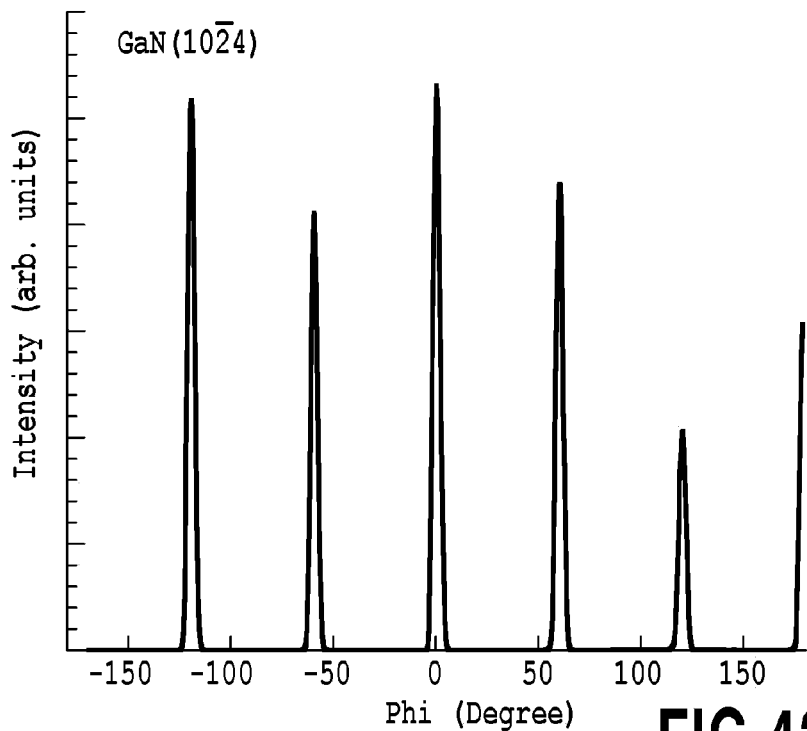
FIG. 42A shows the X-ray diffraction (phi scan) of the wurtzite GaN thin film 13 shown in FIG. 39.
Figure 42B:
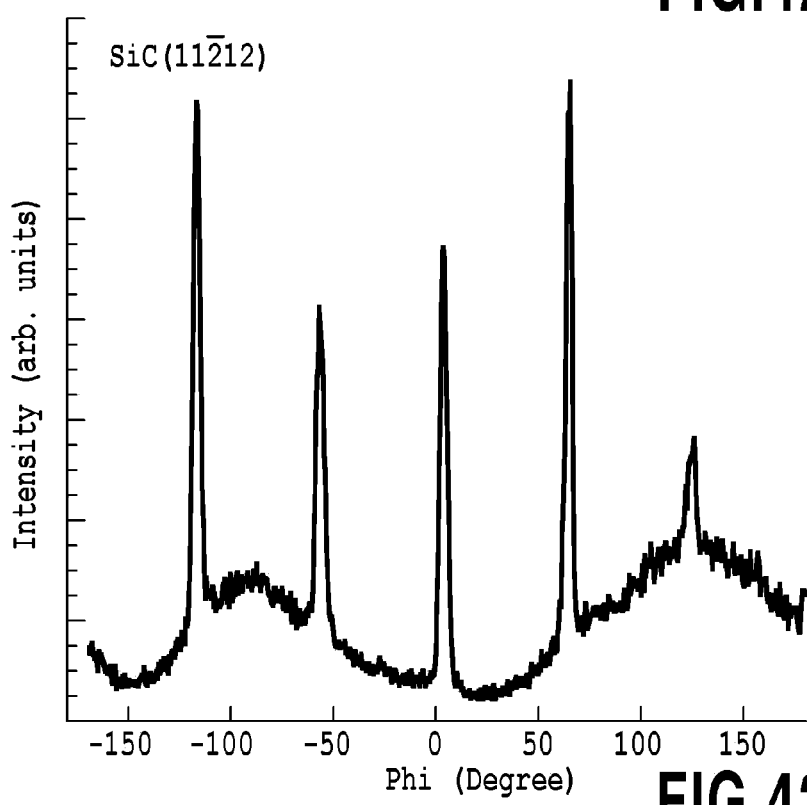
FIG. 42B shows the X-ray diffraction (phi scan) of the 6H-SiC substrate 34 shown in FIG. 39.

FIGS. 42A and 42B show the X-ray diffraction (phi scans) of the wurtzite GaN thin film 13 and the (0001) 6H—SiC substrate 34 shown in FIG. 39, respectively. Six clear GaN (11-24) diffraction peaks are observed. This indicates that the single-crystal wurtzite GaN thin film 13 was able to be grown. From this X-ray diffraction (phi scans), it can be seen that the in-plane orientational relationship among the (0001) 6H—SiC substrate 34, the wurtzite AlN thin film 31, and the wurtzite GaN thin film 13 is 6H-Sic [11-20] ||_AlN [11-20] || GaN [11-20].

The above-described atomic force microscopy (AFM) image, 2θ/ω X-ray diffraction, and X-ray diffraction (phi scans) have revealed that the present invention makes it possible to grow the single-crystal wurtzite GaN thin film 13 on the double heterostructure including the wurtzite AlN thin film 31, the h-BN thin film 12, and the wurtzite AlN thin film 31 on the (0001) 6H—SiC substrate 34 using only an MOCVD system. Since the h-BN layer 12 in the double heterostructure serves as a release layer, the single-crystal wurtzite GaN thin film 13 can be mechanically separated from the (0001) 6H—SiC substrate 34.

Here, with regard to the double heterostructure including the wurtzite AlN thin film 31, the h-BN thin film 12, and the wurtzite AlN thin film 31, results will be described. In the case where the thickness of the h-BN thin film 12 is equal to or more than that of a one-atom-thick layer, the h-BN thin film 12 serves as a release layer, and the single-crystal wurtzite GaN thin film 13 can be mechanically separated from the 6H—SiC substrate 34. Similarly, in the case where a t-BN thin film is used instead of the h-BN thin film 12, also, the t-BN thin film serves as a release layer, and the single-crystal wurtzite GaN thin film 13 can be mechanically separated from the 6H—SiC substrate 34. In the case where a wurtzite-structure $Al_xGa_{1-x}N$ containing not less than 10% Al is used instead of the wurtzite AlN thin film 31 included in the double heterostructure to form a double heterostructure, also, the planar, single-crystal wurtzite GaN thin film 13 can be grown on this double heterostructure.

REFERENCE SIGNS LIST 11 (0001) SAPPHIRE SUBSTRATE
12 h-BN THIN FILM (CORRESPONDING TO "GRAPHITE-STRUCTURE BORON NITRIDE THIN FILM")
13 WURTZITE-STRUCTURE GaN THIN FILM (CORRESPONDING TO "WURTZITE-STRUCTURE AlGaInBN THIN FILM")
13A WURTZITE-STRUCTURE GaN THIN FILM (CORRESPONDING TO "WURTZITE-STRUCTURE AlGaInBN THIN FILM")
13B WURTZITE-STRUCTURE GaN THIN FILM (CORRESPONDING TO "SECOND WURTZITE-STRUCTURE AlGaInBN THIN FILM")
14 WURTZITE-STRUCTURE AlxGa1-xN (x>0) THIN FILM
15 WURTZITE-STRUCTURE InGaN/GaN MULTIPLE-QUANTUM-WELL STRUCTURE
16 Si-DOPED AlxGa1-xN (x>0) THIN FILM
17 Si-DOPED GaN THIN FILM (CORRESPONDING TO "WURTZITE-STRUCTURE AlGaInBN THIN FILM")
18 Mg-DOPED GaN THIN FILM (CORRESPONDING TO "SECOND WURTZITE-STRUCTURE AlGaInBN THIN FILM")
19 LOW-TEMPERATURE GaN BUFFER LAYER
20 RECEPTOR SAPPHIRE SUBSTRATE (CORRESPONDING TO "SECOND SUBSTRATE")
21 CONDUCTIVE DOUBLE-SIDED ADHESIVE TAPE (CORRESPONDING TO "BONDING LAYER")
22 INDIUM METAL SHEET (CORRESPONDING TO "BONDING LAYER")
23 P-TYPE ELECTRODE
24 N-TYPE ELECTRODE
25 WURTZITE-STRUCTURE AlN THIN FILM (CORRESPONDING TO "WURTZITE-STRUCTURE AlGaInBN THIN FILM")

26 WURTZITE-STRUCTURE AlGaN THIN FILM (CORRESPONDING TO "SECOND WURTZITE-STRUCTURE AlGaInBN THIN FILM")
27 POLYCRYSTALLINE COPPER SUBSTRATE (CORRESPONDING TO "SECOND SUBSTRATE")
28 DOUBLE-SIDED ADHESIVE TAPE (CORRESPONDING TO "BONDING LAYER")
29 ZnO SACRIFICIAL LAYER
30 AlN BUFFER LAYER
31 WURTZITE-STRUCTURE AlxGa1-xN (x>0) THIN FILM
32 (111) Si SUBSTRATE
33 WURTZITE AlN BUFFER LAYER
34 (0001) 6H—SiC SUBSTRATE

The invention claimed is:

1. A nitride semiconductor structure comprising:
a graphite-structure boron nitride thin film;
a wurtzite-structure $Al_xGa_{1-x}N$ (x>0) thin film on the graphite-structure boron nitride thin film; and
a wurtzite-structure AlGaInBN thin film on the wurtzite-structure $Al_xGa_{1-x}N$ (x>0) thin film.

2. The nitride semiconductor structure according to claim 1, further comprising:
a sapphire substrate,
wherein the graphite-structure boron nitride thin film and the wurtzite-structure $Al_xGa_{1-x}N$ (x>0) thin film constitute a buffer layer on the sapphire substrate.

3. The nitride semiconductor structure according to claim 1, wherein the graphite-structure boron nitride thin film is any one of a (0001) hexagonal boron nitride thin film and a turbostratic boron nitride thin film.

4. The nitride semiconductor structure according to claim 3, wherein the graphite-structure boron nitride thin film has a film thickness equal to or more than that of a one-atom-thick layer.

5. The nitride semiconductor structure according to claim 3, wherein the graphite-structure boron nitride thin film has a film thickness equal to or more than that of a one-atom-thick layer.

6. The nitride semiconductor structure according to claim 1, further comprising:
15 a multiple-quantum-well structure on the wurtzite-structure AlGaInBN thin film; and
13B a second wurtzite-structure AlGaInBN thin film on the multiple-quantum-well structure.

7. The nitride semiconductor structure according to claim 1, further comprising:
a bonding layer on a substrate other than a sapphire substrate,
wherein the wurtzite-structure $Al_xGa_{1-x}N$ (x>0) thin film and the graphite-structure boron nitride thin film constitute a buffer layer.

8. The nitride semiconductor structure according to claim 7, wherein the bonding layer is conductive.

9. The nitride semiconductor structure according to claim 1, further comprising:
a sapphire substrate;
any one of wurtzite AlN thin film, a wurtzite GaN thin film, and a wurtzite AlGaN thin film on the sapphire substrate; and
a wurtzite-structure $Al_xGa_{1-x}N$ (x>0) thin film on the any one of the wurtzite AlN thin film, the wurtzite GaN thin film, and the wurtzite AlGaN thin film,
wherein the any one of the wurtzite AlN, the wurtzite GaN thin film, and the wurtzite AlGaN thin film constitutes a buffer layer on the sapphire substrate, and
the wurtzite-structure $Al_xGa_{1-x}N$ (x>0) thin film, the graphite-structure boron nitride thin film, and the wurtzite-structure $Al_xGa_{1-x}N$ (x>0) thin film constitute a double heterostructure on the buffer layer.

10. The nitride semiconductor structure according to claim 9, wherein the graphite-structure boron nitride thin film is any one of a (0001) hexagonal boron nitride thin film and a turbostratic boron nitride thin film.

11. The nitride semiconductor structure according to claim 10, wherein the graphite-structure boron nitride thin film has a film thickness equal to or more than that of a one-atom-thick layer.

12. The nitride semiconductor structure according to claim 1, further comprising:
a Si substrate;
a wurtzite AlN thin film on the Si substrate; and
a wurtzite-structure $Al_xGa_{1-x}N$ (x>0) thin film on the wurtzite AlN thin film,
wherein the wurtzite AlN thin film constitutes a buffer layer on the Si substrate, and
the wurtzite-structure $Al_xGa_{1-x}N$ (x>0) thin film, the graphite-structure boron nitride thin film, and the wurtzite-structure $Al_xGa_{1-x}N$ (x>0) thin film constitute a double heterostructure on the buffer layer.

13. The nitride semiconductor structure according to claim 12, wherein the graphite-structure boron nitride thin film is any one of a (0001) hexagonal boron nitride thin film and a turbostratic boron nitride thin film.

14. The nitride semiconductor structure according to claim 13, wherein the graphite-structure boron nitride thin film has a film thickness equal to or more than that of a one-atom-thick layer.

15. The nitride semiconductor structure according to claim 1, further comprising:
a SiC substrate; and
a wurtzite-structure $Al_xGa_{1-x}N$ (x>0) thin film on the SiC substrate,
wherein the wurtzite-structure $Al_xGa_{1-x}N$ (x>0) thin film, the graphite-structure boron nitride thin film, and the wurtzite-structure $Al_xGa_{1-x}N$ (x>0) thin film constitute a double heterostructure on the SiC substrate.

16. The nitride semiconductor structure according to claim 15, wherein the graphite-structure boron nitride thin film is any one of a (0001) hexagonal boron nitride thin film and a turbostratic boron nitride thin film.

17. The nitride semiconductor structure according to claim 16, wherein the graphite-structure boron nitride thin film has a film thickness equal to or more than that of a one-atom-thick layer.

18. The method according to claim 1, wherein the graphite-structure boron nitride thin film and the wurtzite-structure $Al_xGa_{1-x}N$ (x>0) thin film constitute a buffer layer on the sapphire substrate.

19. The method according to claim 1, wherein the graphite-structure boron nitride thin film is any one of a (0001) hexagonal boron nitride thin film and a turbostratic boron nitride thin film.

20. A method of making a nitride semiconductor structure, comprising:
growing a graphite-structure boron nitride thin film on a sapphire substrate;
growing a wurtzite-structure $Al_xGa_{1-x}N$ (x>0) thin film on the graphite-structure boron nitride thin film; and
growing a wurtzite-structure AlGaInBN thin film on the wurtzite-structure $Al_xGa_{1-x}N$ (x>0) thin film.

* * * * *